United States Patent
Hashimoto et al.

(10) Patent No.: US 9,254,566 B2
(45) Date of Patent: Feb. 9, 2016

(54) ROBOT HAVING END EFFECTOR AND METHOD OF OPERATING THE SAME

(75) Inventors: Yasuhiko Hashimoto, Kobe (JP); Tetsuya Yoshida, Kakogawa (JP)

(73) Assignee: KAWASAKI JUKOGYO KABUSHIKI KAISHA, Kobe-Shi (JP)

( * ) Notice: Subject to any disclaimer, the term of this patent is extended or adjusted under 35 U.S.C. 154(b) by 956 days.

(21) Appl. No.: 12/656,358

(22) Filed: Jan. 27, 2010

(65) Prior Publication Data
US 2010/0290886 A1 Nov. 18, 2010

Related U.S. Application Data

(60) Provisional application No. 61/202,579, filed on Mar. 13, 2009.

(51) Int. Cl.
| | |
|---|---|
| B25J 15/00 | (2006.01) |
| B25J 9/04 | (2006.01) |
| B25J 9/10 | (2006.01) |
| H01L 21/677 | (2006.01) |

(52) U.S. Cl.
CPC .. *B25J 9/042* (2013.01); *B25J 9/10* (2013.01); *B25J 15/0052* (2013.01); *H01L 21/67742* (2013.01); *Y10S 414/137* (2013.01); *Y10S 414/141* (2013.01); *Y10T 74/20305* (2015.01)

(58) Field of Classification Search
CPC .............................. B25J 9/10; H01L 21/67742
USPC ........... 414/744.5, 806, 941; 294/213; 901/30
See application file for complete search history.

(56) References Cited

U.S. PATENT DOCUMENTS

| | | | | |
|---|---|---|---|---|
| 6,116,848 | A * | 9/2000 | Thomas et al. | 414/754 |
| 7,156,602 | B2 * | 1/2007 | Farassat | 414/331.18 |
| 8,246,289 | B2 * | 8/2012 | Ha | 414/744.5 |
| 2004/0228719 | A1 * | 11/2004 | Woodruff et al. | 414/744.5 |
| 2005/0123383 | A1 | 6/2005 | Goto et al. | |
| 2005/0287769 | A1 | 12/2005 | Lee | |
| 2007/0017560 | A1 | 1/2007 | Kiyota | |
| 2007/0199860 | A1 | 8/2007 | Asari et al. | |
| 2009/0067974 | A1 * | 3/2009 | Ha | 414/744.5 |

FOREIGN PATENT DOCUMENTS

| | | |
|---|---|---|
| JP | A-4-180246 | 6/1992 |
| JP | A-5-152266 | 6/1993 |

(Continued)

OTHER PUBLICATIONS

International Search Report mailed Apr. 20, 2010 issued in International Patent Application No. PCT/JP2010/051224 (with translation).

(Continued)

*Primary Examiner* — Scott Lowe
(74) *Attorney, Agent, or Firm* — Oliff PLC

(57) ABSTRACT

The present invention relates to an end effector including: blade members for holding substrates, each configured to hold the substrate, and configured such that each interval between the blade members can be changed; a blade support unit configured to support the blade members, the blade support unit being configured to be driven integrally with the blade members by the robot; and blade drive means configured to change the interval between the blade members by moving at least one of the blade members relative to another blade member.

15 Claims, 16 Drawing Sheets

(56) References Cited

FOREIGN PATENT DOCUMENTS

| JP | A-6-177224 | 6/1994 |
|---|---|---|
| JP | A-7-297255 | 11/1995 |
| JP | H09-205127 A | 8/1997 |
| JP | A-10-41371 | 2/1998 |
| JP | A-10-335427 | 12/1998 |
| JP | A-2000-58622 | 2/2000 |
| JP | A-2002-231787 | 8/2002 |
| JP | A-2005-116807 | 4/2005 |
| JP | A-2005-311306 | 11/2005 |
| JP | 2006-313865 A | 11/2006 |
| JP | A 2007-35792 | 2/2007 |
| JP | A-2007-242980 | 9/2007 |
| JP | A-2008-141158 | 6/2008 |

OTHER PUBLICATIONS

Jul. 22, 2014 Office Action issued in Japanese Patent Application No. 2013-213748 (with translation).

Mar. 3, 2015 Office Action issued in Japanese Application No. 2014-053755.

* cited by examiner

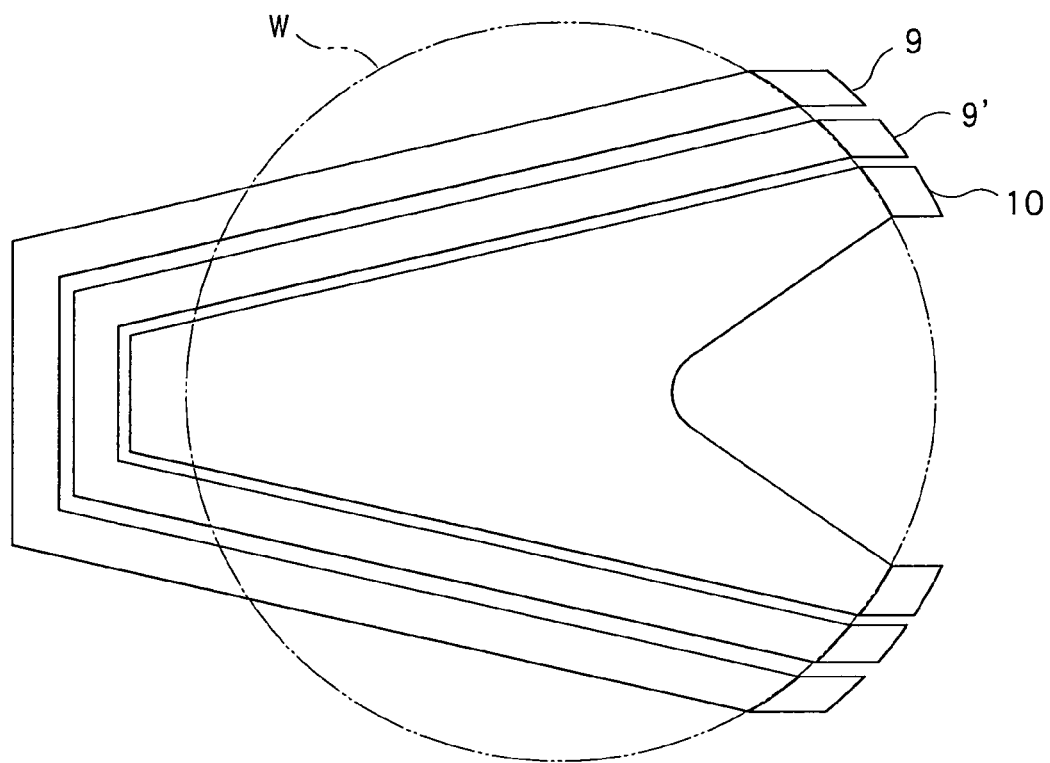
F I G. 8
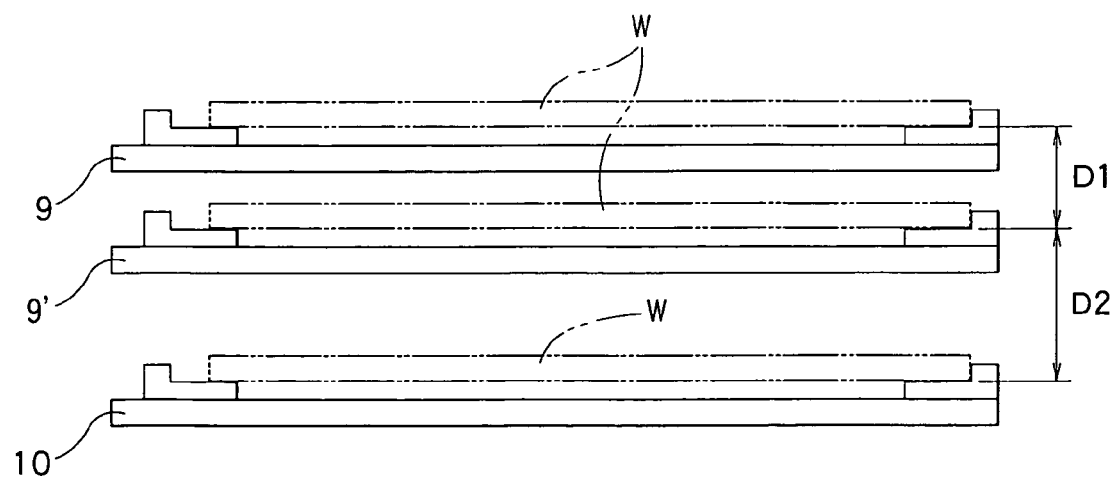
F I G. 9

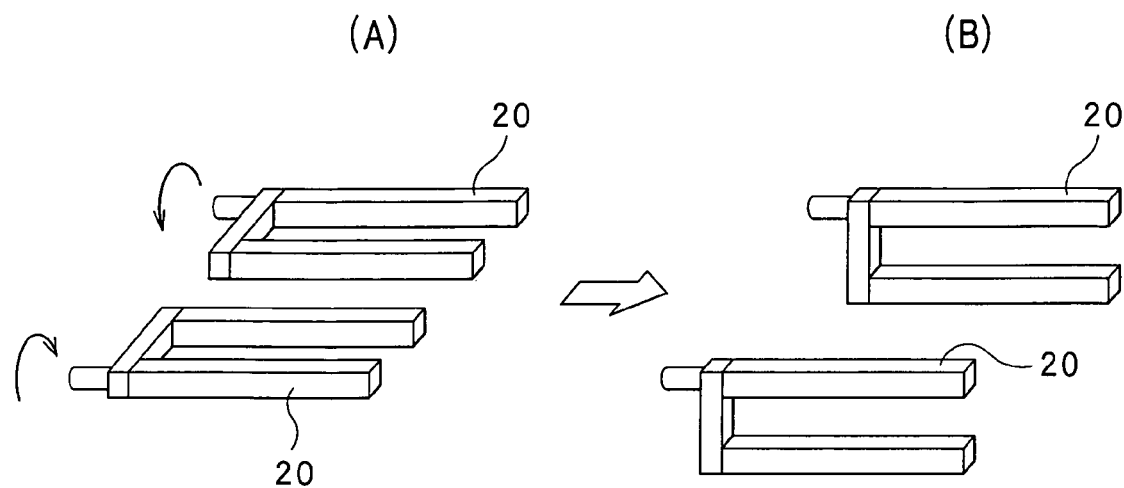
F I G . 1 0
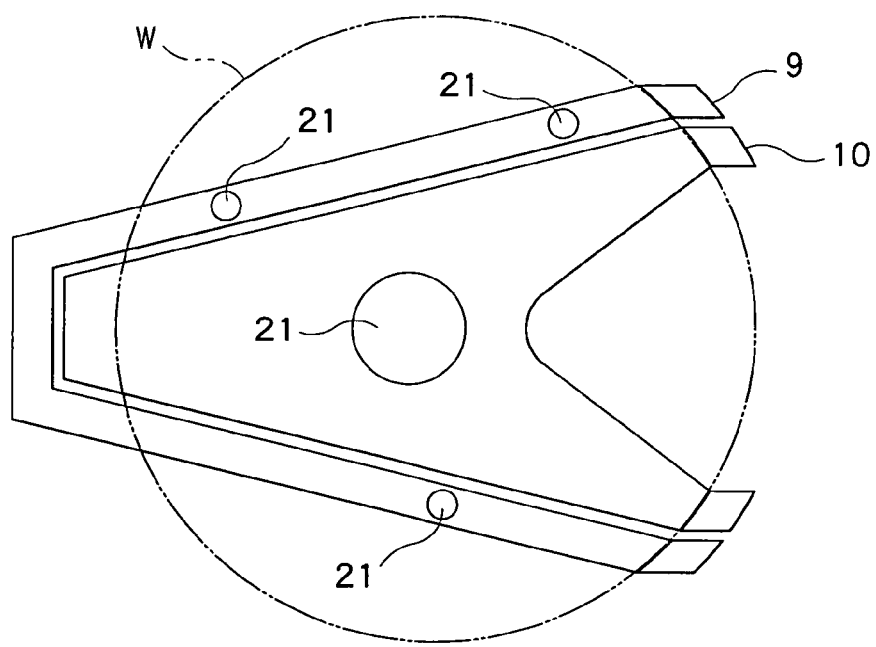
F I G . 1 1

ROBOT HAVING END EFFECTOR AND METHOD OF OPERATING THE SAME

This nonprovisional application claims the benefit of U.S. Provisional Application No. 61/202,579, filed Mar. 13, 2009.

TECHNICAL FIELD

The present invention relates to a robot having an end effector and a method of operating the robot. In particular, this invention relates to the robot provided with the end effector capable of carrying a plurality of substrates at a time, as well as relates to the method of operating this robot.

BACKGROUND ART

In production of semiconductors, liquid crystal panels or the like, high-speed transfer and highly cleaned atmospheres for the substrates, such as wafers, glass plates or the like, have been required more and more. For instance, in the field of producing the semiconductors, an effective means for taking out the wafers from a cassette and then carrying them into a suitable container (or another cassette) for receiving them therein at a relatively high speed has been demanded.

In some cases, upon carrying the wafers to and from an apparatus for providing a certain process to the wafers, a hand (or end effector) of the robot used for carrying each wafer (or wafers) into the apparatus before the wafer is subjected to the process should be changed with another hand for taking out the wafer from the apparatus after the wafer is subjected to the process.

For instance, in the case of the robot employed in the apparatus for cleaning the wafers, the hand for handling unclean wafers (i.e., the wafers before cleaned) should be securely changed with the hand for handling clean wafers (i.e., the wafers after cleaned), or vice versa. Further, in the case of the robot for carrying the wafers to and from the apparatus for processing the wafers under a high temperature condition, the hand for handling the wafers under the high temperature condition should be changed with the hand for handling the wafers in a normal temperature state, or vice versa.

Usually, two hands are provided to the robot for carrying and/or handling the wafers as described above. In this case, each hand is exclusively used for each purpose as described above. Therefore, the operation of such two hands may tend to require so much time and skill, making it rather difficult to substantially enhance the throughput.

Employment of a large number of robots, each having such two hands as described above, could actually enhance the throughput of the wafer transfer. However, this approach should rather increase the cost required for the equipment, thus canceling the effect of reducing the cost that could be obtained by such enhancement of the throughput. Furthermore, the fact that two robots cannot access one wafer cassette at a time also makes it difficult to enhance the throughput.

To address such problems, one approach can be mentioned, in which a plurality of hands are fixedly provided to one robot arm, while being vertically shifted in position along the robot arm, with an interval between the hands corresponding to a pitch of the wafers to be respectively stored and arranged in the cassette. With this approach, the wafers can be carried, collectively at a time, to and from the wafer cassette. For instance, if two hands are provided to the one robot arm, while being vertically shifted along the robot arm with the interval between the hands corresponding to the pitch of the wafers, two wafers can be actually carried at a time.

However, in such a case in which the plurality of hands are fixedly provided to the one robot arm while being vertically shifted in position along the robot arm, depending on the position of slots in the wafer cassette, the other hand holding no wafer may interfere with the cassette and/or wafers already inserted in the cassette upon insertion of the wafer into the cassette, so that the wafer held on the hand can no longer be inserted in the cassette.

For instance, upon insertion of the wafers into the wafer cassette capable of storing therein twenty five (25) sheets of wafers by using the robot having two hands provided to the one robot arm thereof, two wafers, respectively taken out for each operation by the two hands from the container or cassette located on the take-out side, are carried in succession into the wafer cassette located on the take-in side. However, upon the insertion of the last one wafer finally left in the container or cassette located on the take-out side, the one hand holding no wafer may tend to interfere with the wafers already inserted in the cassette and/or cassette itself. Therefore, this robot cannot securely carry such a twenty-fifth wafer.

Further, in the case of carrying one wafer from any given slot (e.g., a first slot) of one cassette located on the take-out side into the same slot (i.e., the first slot) or different slot (e.g., a third slot) of another cassette located on the take-in (or wafer receiving) side, a similar interferential problem may tend to occur between the hands and the wafers already carried in the cassette.

Namely, in such a robot having the plurality of hands, which are fixedly provided to the one robot arm while being vertically shifted in position along the robot arm, there still remain many restrictions and problems that may rather deteriorate flexibility in the operation of the robot.

SUMMARY OF THE INVENTION

The present invention was made in light of the above circumstances. Therefore, it is an object of this invention to provide an improved end effector which can significantly enhance the throughput of the wafer (or substrate) transfer as well as can highly improve the flexibility in the operation for carrying the wafers (or substrates). It is another object of this invention to provide the robot having the end effector of this invention and a new method of operating this robot.

To achieve the above challenges, in one feature (1) of the present invention, an end effector configured to be provided to an arm of a robot, comprises: a plurality of blade members for holding substrates, each of the blade members being configured to hold each of the substrates, and the blade members being configured such that each interval between the blade members can be changed; a blade support unit configured to support the blade members, the blade support unit being configured to be driven integrally with the blade members by the robot; and blade drive means configured to change the interval between the blade members by moving at least one of the blade members relative to another blade member.

In another aspect (2) of the above invention (1), the blade members are respectively configured not to be overlapped with one another when seen in a direction perpendicular to a surface of the substrate held by each blade member.

In another aspect (3) of the above invention (1) or (2), the interval between the blade members is defined as an interval in a direction perpendicular to a surface of the substrate held by each blade member.

In another aspect (4) of the above invention (3), a direction in which the blade member is moved by the blade drive means is the direction perpendicular to the surface of the substrate.

In another aspect (5) of any one of the above inventions (1) to (4), the blade members respectively have substrate holding parts configured to be brought into contact with the substrates. The substrate holding parts of the blade members are configured to be substantially flush with one another when the interval between the blade members is shortened by the blade drive means.

In another aspect (6) of any one of the above inventions (1) to (5), a total thickness of the blade members in a direction perpendicular to a surface of the substrate is reduced to be less than a predetermined thickness when the interval between the blade members is shortened by the blade drive means.

In another aspect (7) of the above invention (6), the predetermined thickness corresponds to a substrate arrangement pitch of multiple stages on which substrates are respectively placed.

In another aspect (8) of the above invention (6), the predetermined thickness is set as a blade-insertable thickness defined between adjacent two stages of the multiple stages on which the substrates are respectively placed.

In another aspect (9) of any one of the above inventions (1) to (8), the blade drive means is configured to selectively determine either one of a maximum interval and a minimum interval between the blade members.

In another aspect (10) of the above invention (9), the blade drive means includes a fluid-pressure cylinder.

In another aspect (11) of any one of the above inventions (1) to (8), the blade drive means is configured to determine the interval between the blade members as any value between a maximum interval and a minimum interval.

In another aspect (12) of the above invention (11), the blade drive means includes a servo-motor.

In another aspect (13) of any one of the above inventions (9) to (12), the blade members include at least three blade members, and the maximum interval of such blade members varies with each pair of adjacent blade members.

In another aspect (14) of any one of the above inventions (9) to (13), when adjacent two blade members are positioned to take the maximum interval therebetween, and when the interval between the adjacent two blade members is designated by D and a substrate arrangement pitch of multiple stages on which the substrates are respectively placed is designated by P, a following expression $$nP < D < (n+1)P \text{ (wherein } n \text{ is a natural number including 0)}$$

can be established.

In another aspect (15) of any one of the above inventions (1) to (14), each of the blade members has holding means configured to hold the substrate in order to prevent the substrate from being detached from the blade member upon transferring the substrate by the blade member.

In another aspect (16) of the above invention (15), the holding means includes an edge guide mechanism having a movable contact part configured to be brought into releasable contact with an edge of the substrate.

In another aspect (17) of the above invention (16), the blade drive means is configured to selectively determine either one of a maximum interval and a minimum interval between the blade members. An interval between the movable contact parts of respective adjacent blade members is set to correspond to the maximum interval.

In another aspect (18) of the above invention (15), the holding means has a suction mechanism including a suction member which is configured to provide a vacuum suction to the substrate.

In a second feature (19) of the present invention, an end effector configured to be provided to an arm of a robot, comprises: a plurality of blade members for holding substrates, each of the blade members being configured to hold each of the substrates, and at least one of the blade members being configured to be movable relative to another blade member; a blade support unit configured to support the blade members, the blade support unit being configured to be driven integrally with the blade members by the robot; and blade drive means configured to move the at least one blade member relative to the another blade member, whereby a state in which a substrate holding face of the at least one blade member is positioned on a substrate holding side relative to a substrate holding face of the another blade member and a state in which the substrate holding face of the another blade member is positioned on the substrate holding side relative to the substrate holding face of the at least one blade member can be switched in a direction perpendicular to a surface of the substrate held by each blade member.

In another aspect (20) of the above invention (19), the blade members are respectively configured not to be overlapped with one another when seen in a direction perpendicular to the surface of each substrate.

In another aspect (21) of the above invention (19) or (20), a direction in which the blade member is moved by the blade drive means is the direction perpendicular to the surface of the substrate.

In another aspect (22) of any one of the above inventions (19) to (21), a maximum distance in the direction perpendicular to the surface of the substrate between the substrate holding face of the at least one blade member and the substrate holding face of the another blade member is set within a range of a substrate arrangement pitch of multiple stages on which the substrates are respectively placed.

In another aspect (23) of any one of the above inventions (19) to (22), a maximum total thickness of the blade members in the direction perpendicular to the surface of the substrate is less than a blade-insertable thickness defined between adjacent two stages of multiple stages on which the substrates are respectively placed.

In another aspect (24) of any one of the above inventions (19) to (23), each of the blade members has holding means configured to hold the substrate in order to prevent the substrate from being detached from the blade member upon transferring the substrate by the blade member.

In another aspect (25) of the above invention (24), the holding means includes an edge guide mechanism having a movable contact part configured to be in brought into releasable contact with an edge of the substrate.

In another aspect (26) of the above invention (24), the holding means has a suction mechanism including a suction member which is configured to provide a vacuum suction to the substrate.

In another feature (27) of the present invention, the robot includes: the end effector as set forth in any one of the above inventions (1) to (18); and the arm having the end effector provided to the arm In another feature (28) of the present invention, the robot includes: the end effector as set forth in any one of the above inventions (19) to (26); and the arm having the end effector provided to the arm.

In another aspect (29) of the above invention (27), an additional end effector is provided together with the end effector such that the additional end effector can be driven independently of the end effector.

In another aspect (30) of the above invention (28), an additional end effector is provided together with the end effector such that the additional end effector can be driven independently of the end effector.

In another aspect (31) of the above invention (30), an interval between the substrate holding face of the blade member of the end effector and the substrate holding face of the blade member of the additional end effector is set to correspond to a substrate arrangement pitch of multiple stages on which substrates are respectively placed.

In another aspect (32) of the above invention (29) or (30), the additional end effector is the end effector according to any one of claims 1 to 26.

In another aspect (33) of the above invention (29) or (30), the additional end effector has a plurality of blade members, each of the blade members being configured to hold the substrate, while an interval between the blade members of the additional end effector is fixed.

In another feature (34) of the present invention, the method of operating the robot as set forth in the above invention (27) includes the steps of: carrying two or more substrates at a time by using two or more blade members of the end effector; and carrying one substrate by using the end effector in a state that the interval between the blade members is shortened by the blade drive means.

In another feature (35) of the present invention, the method of operating the robot as set forth in any one of the above inventions (29) to (33) includes the steps of: carrying a plurality of substrates at a time by using both of the end effector and the additional end effector; and carrying one or more substrates by using either one of the end effector and the additional end effector.

In another feature (36) of the present invention, the method of operating the robot as set forth in the above invention (28) includes the step of: changing conditions of applications between the at least one blade member and the another blade member.

In another aspect (37) of the above invention (36), the conditions of applications include those for handling clean substrates and for handling unclean substrates and/or those for handling the substrates at a high temperature and for handling the substrates at a normal temperature.

BRIEF DESCRIPTION OF THE DRAWINGS

FIG. 8 is a schematic plan view showing one variation of the end effector of the robot shown in FIG. 1 with three blade members provided to the end effector.

FIG. 9 is a schematic side view of the end effector shown in FIG. 8.

FIG. 10 is a schematic perspective view showing one variation of a blade lift mechanism used for the end effector of the robot shown in FIG. 1.

FIG. 11 is a schematic plan view showing another variation of the end effector of the robot shown in FIG. 1, wherein the end effector includes a wafer suction mechanism.

DETAILED DESCRIPTION OF THE INVENTION

Hereinafter, the robot having the end effector according to the first embodiment of the present invention and the method of operating this robot will be described with reference to the drawings.

Figure 1:
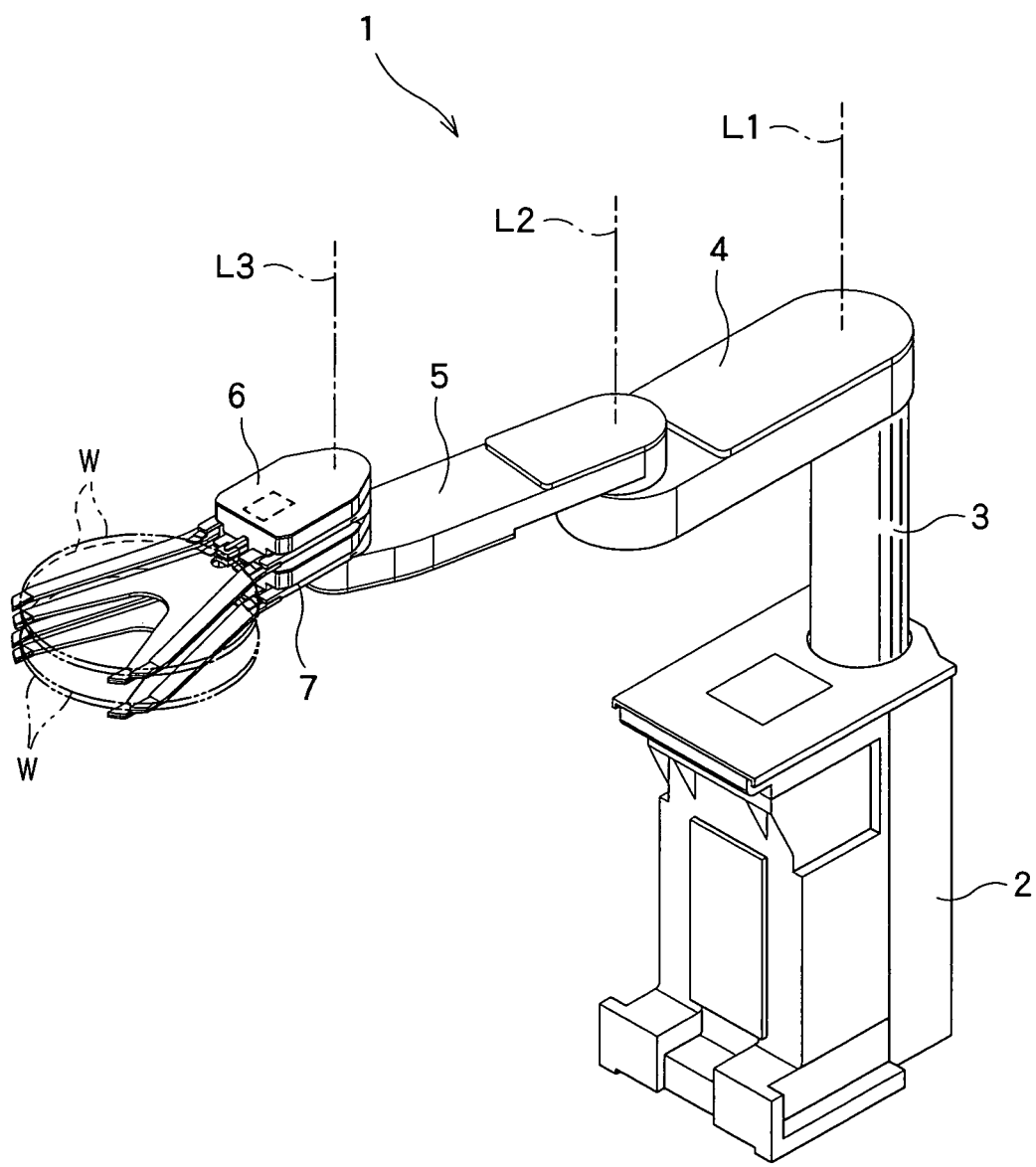
FIG. 1 is a perspective view showing a robot having an end effector according to one (or first) embodiment of the present invention.

As shown in FIG. 1, the robot 1 according to this embodiment includes a robot base 2 and a lift main cylinder 3 provided to the robot base 2. The lift main cylinder 3 can be vertically moved along a first vertical axis L1 as well as rotated about the same axis L1 by a lift mechanism and a rotating mechanism respectively provided in the robot base 2.

A proximal end of a first arm 4 is connected with a top end of the lift main cylinder 3, while a distal end of the first arm 4 is connected with a proximal end of a second arm 5 that can be rotated about a second vertical axis L2. A distal end of the second arm 5 is connected with both of a first end effector 6 and a second end effector 7, such that these end effectors 6, 7 can be rotated independently about a third vertical axis L3.

Typically, the first end effector 6 and second end effector 7 of the robot 1 have substantially the same configuration suitable for carrying semiconductor wafers W, respectively.

Figure 2:
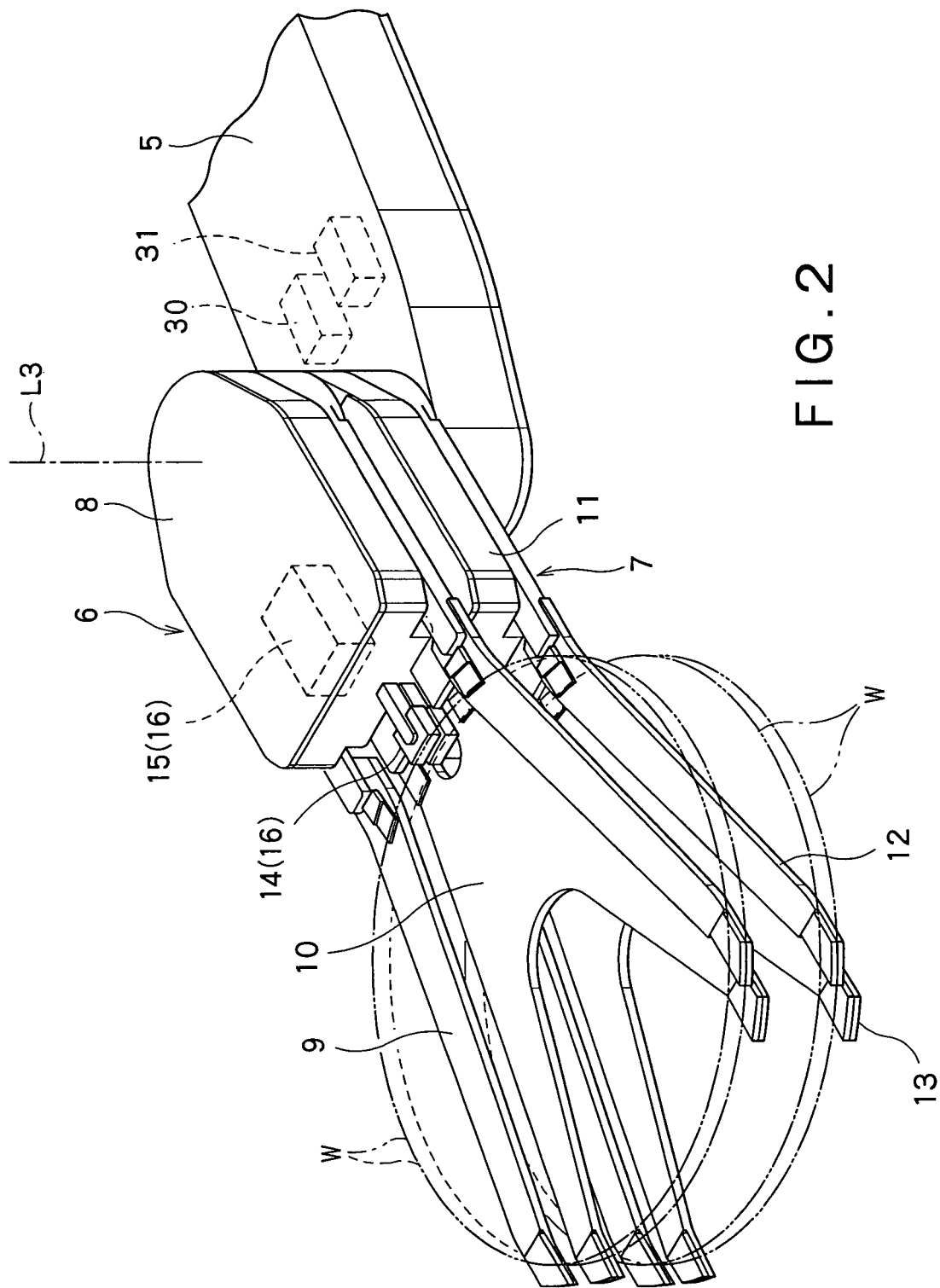
FIG. 2 is an enlarged perspective view showing a part of the end effector of the robot shown in FIG. 1.

As shown in FIG. 2, the first end effector 6 of the robot 1 includes one blade support unit 8 attached to the distal end of the second arm 5, such that this support unit 8 can be rotated about the third vertical axis L3. A movable blade 9 and a fixed blade 10, respectively configured to hold the wafers W, are provided to the blade support unit 8.

Similarly, the second end effector 7 includes another blade support unit 11 attached to the distal end of the second arm 5, such that this support unit 11 can also be rotated about the third vertical axis L3. Further, another movable blade 12 and another fixed blade 13, respectively configured to hold the wafers W, are provided to the blade support unit 11.

The blade support unit 8 of the first end effector 6 is rotated about the third vertical axis L3 by a support unit drive means 30 provided to the robot 1. Meanwhile, the blade support unit 11 of the second end effector 7 is rotated by another support unit drive means 31 of the robot 1. In this case, the first end effector 6 and second end effector 7 are designed to be rotated independently relative to each other by the respective support unit drive means 30, 31.

In addition, the edge guide mechanisms (or holding means) 16, each including the movable contact part 14 configured to be brought into releasable contact with an edge of each wafer W and an air cylinder 15 adapted for reciprocating the movable contact part 14, are provided to the first end effector 6. The edge guide mechanisms 16 are respectively provided to be driven independently relative to each other corresponding to upper and lower wafers W.

In this case, each edge guide mechanism 16 can be used for holding each wafer W to be carried by the first end effector 6 as well as serve as a detector for checking existence of the wafer W.

Another pair of such upper and lower edge guide mechanisms are also provided to the second end effector 7.

Now, referring to FIGS. 3 and 4, the blade drive means adapted for lifting the movable blade 9 of the first end effector 6 will be described. In the drawings, for better understanding and clarity, the positions of respective distal ends of the movable blade 9 and fixed blade 10 are even in the forward direction (in fact, however, as shown in FIG. 2, these distal ends are shifted in position relative to each other in the forward direction).

Another air cylinder 17 is provided in the blade support unit 8 of the first end effector 6, wherein a distal end of a plunger 18 of the air cylinder 17 is attached to a proximal end of the movable blade 9. Further, a lift guide 19 adapted for guiding and supporting the lift of the movable blade 9 is provided in the blade support unit 8. In the lift guide 19, an upper stopper 19A and a lower stopper 19B are provided for respectively determining an upper limit position and a lower limit position of the movable blade 9.

Thus, the movable blade 9 can be lifted with vertical reciprocation of the plunger 18 of the air cylinder 17. In this way, the interval in the vertical direction (i.e., the interval in the direction along the third vertical axis L3) between the movable blade 9 and the fixed blade 10 can be altered.

The second end effector 7 has substantially the same configuration as the configuration of the first end effector 6.

Figure 4:
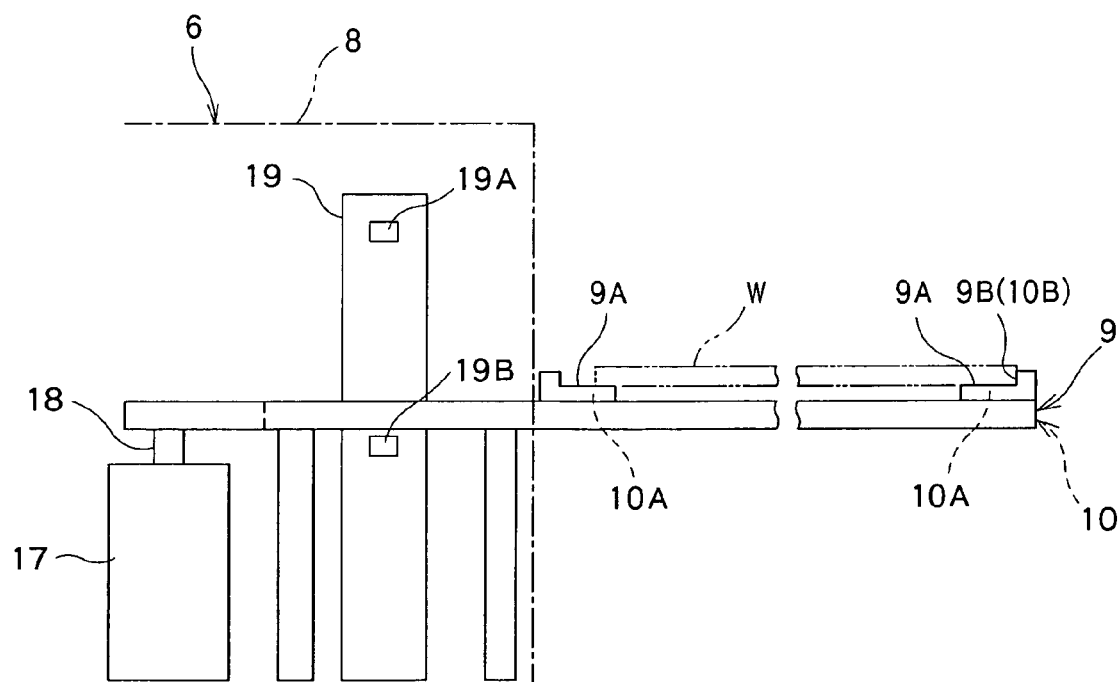
FIG. 4 is a schematic view showing the construction of the end effector of the robot shown in FIG. 1 with the upper and lower blades brought closer to each other.
Figure 5:
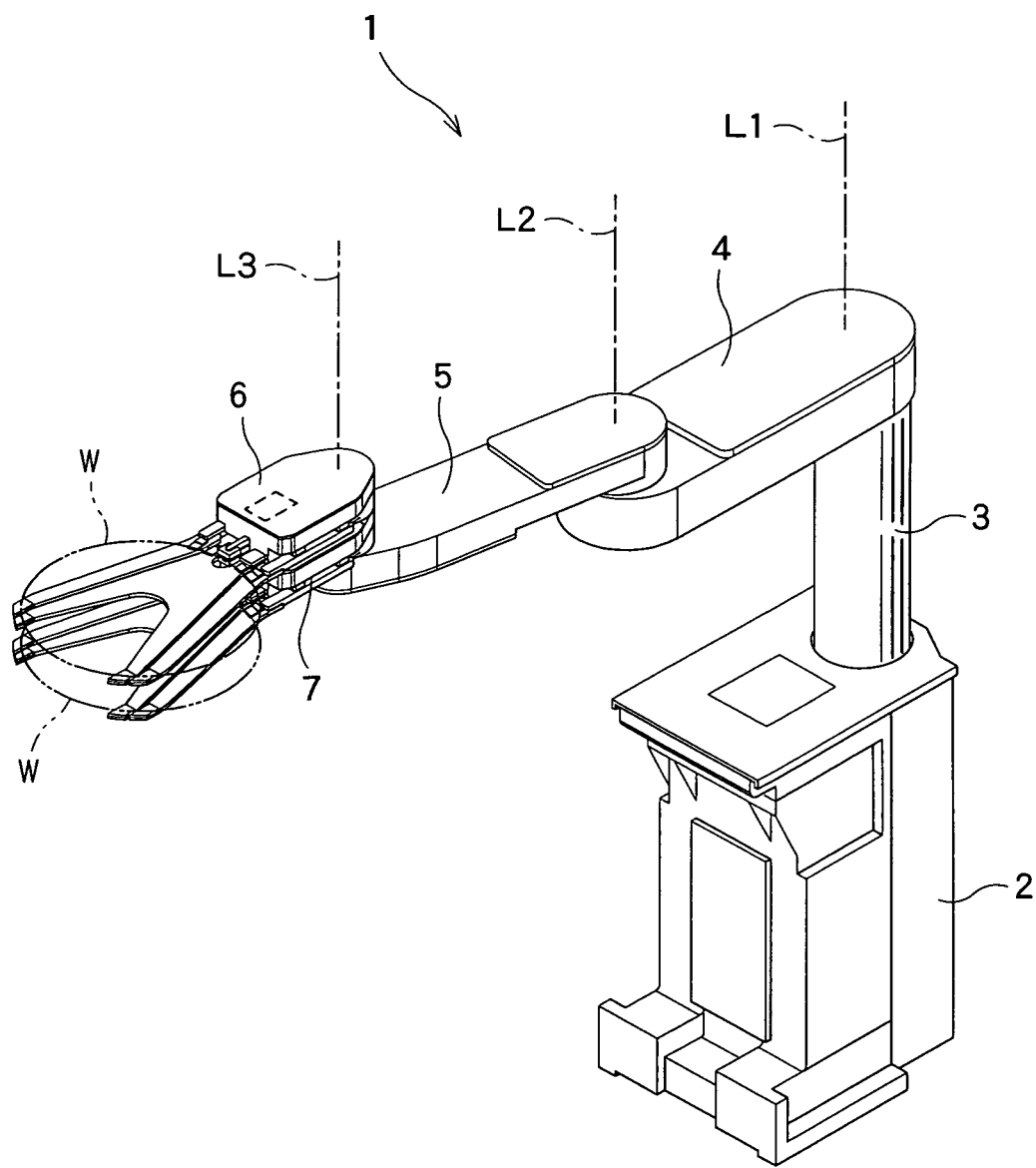
FIG. 5 is a perspective view showing the end effector of the robot shown in FIG. 1 with the upper and lower blades brought closer to each other.
Figure 6:
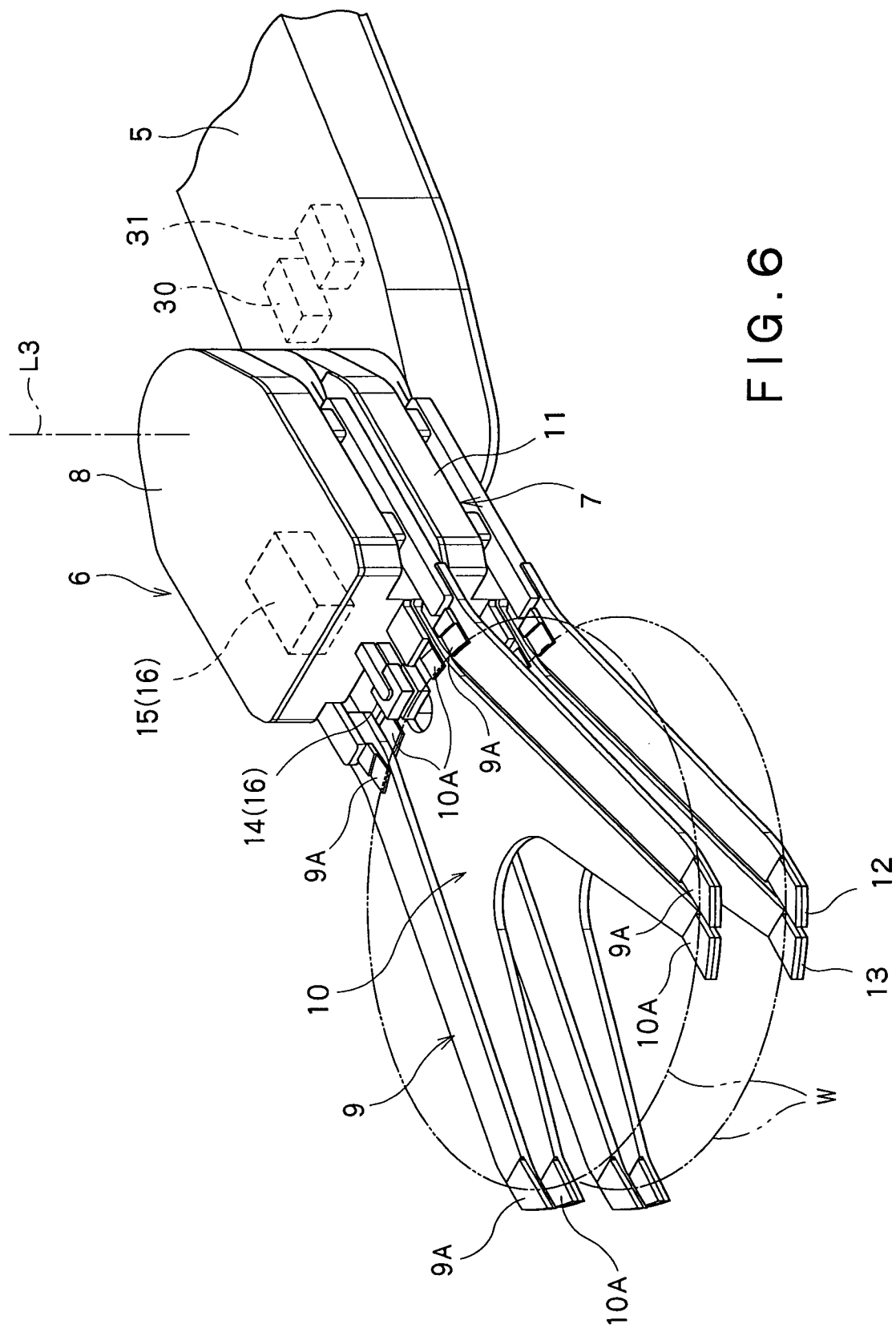
FIG. 6 is an enlarged perspective view showing a part of the end effector of the robot shown in FIG. 5.

In this embodiment, as shown in FIGS. 4 through 6, when the movable blade 9 is lowered by the air cylinder 17 up to the lower limit position thereof, the fixed blade 10 is positioned inside the movable blade 9 (see FIG. 6). In other words, the fixed blade 10 is configured to be nested in the movable blade 9. As such, when seen in the direction vertical to the respective blades, the fixed blade 10 will not be overlapped with the movable blade 9. In addition, when the movable blade 9 is lowered by the air cylinder 17 up to the lower limit position thereof, each wafer holding face 9A of the movable blade 9 will be substantially flush with each wafer holding face 10A of the fixed blade 10.

Further, positioning parts 9B, 10B, each configured to be brought into contact with an edge of the wafer W and serve to determine the position of the wafer held on each blade 9, 10, are respectively provided adjacent to the wafer holding faces 9A, 10A. With this configuration, when each wafer holding face 9A is substantially flush with each wafer holding face 10A, as shown in FIG. 4, both of the positioning parts 9B, 10B will take positions respectively arranged along the circumference of a circle defined by the edge of the wafer W. In this way, such positioning parts 9B, 10B can be brought together into contact with the edge of one wafer W, thereby determining the position of this wafer W.

Figure 3:
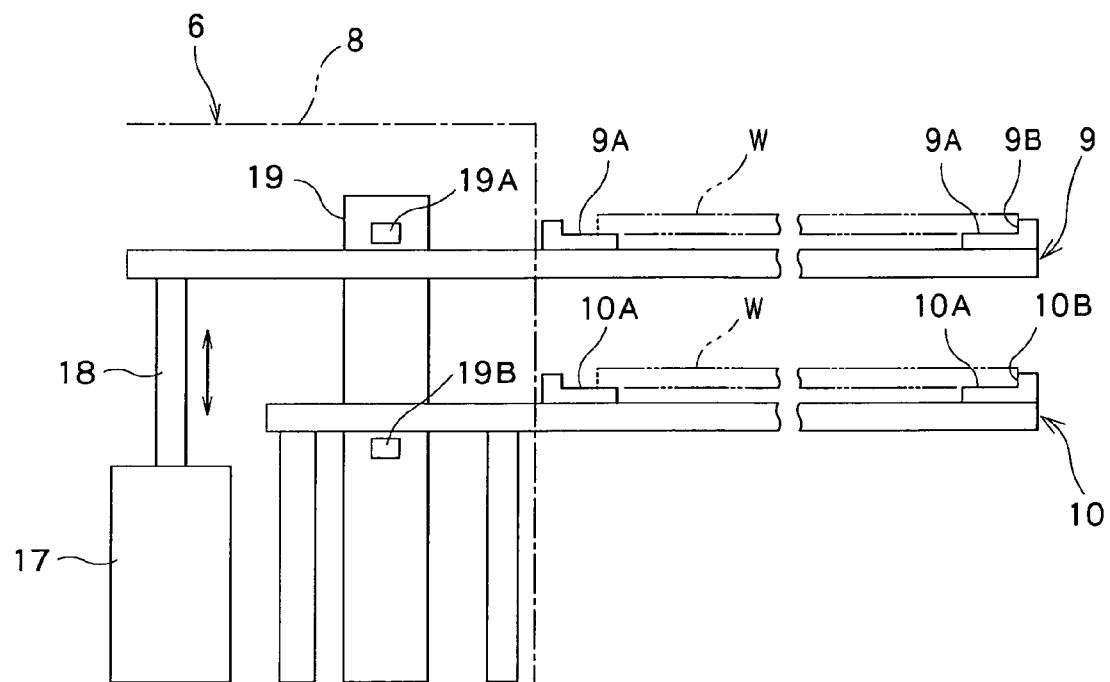
FIG. 3 is a schematic view showing the construction of the end effector of the robot shown in FIG. 1 with upper and lower blades spaced away from each other.

Thus, in this embodiment, with the vertical reciprocation of the plunger 18 of the air cylinder 17, either one of the maximum interval (i.e., the interval between the blades spaced farthest away from each other as shown in FIG. 3) and minimum interval (i.e., the interval between the blades positioned nearest to each other as shown in FIG. 4), in the vertical direction between the movable blade 9 and the fixed blade 10 can be selectively determined. Preferably, the minimum interval is set at zero (0).

It is noted that each movable contact part 14 of the pair of upper and lower edge guide mechanisms 16 as shown in FIG. 2 is located in such a position that the contact part 14 can be brought into contact with the edge of each wafer W, when the interval in the vertical direction between the movable blade 9 and the fixed blade 10 is the maximum interval (i.e., the interval between the blades spaced farthest away from each other as shown in FIG. 3).

Figure 7:
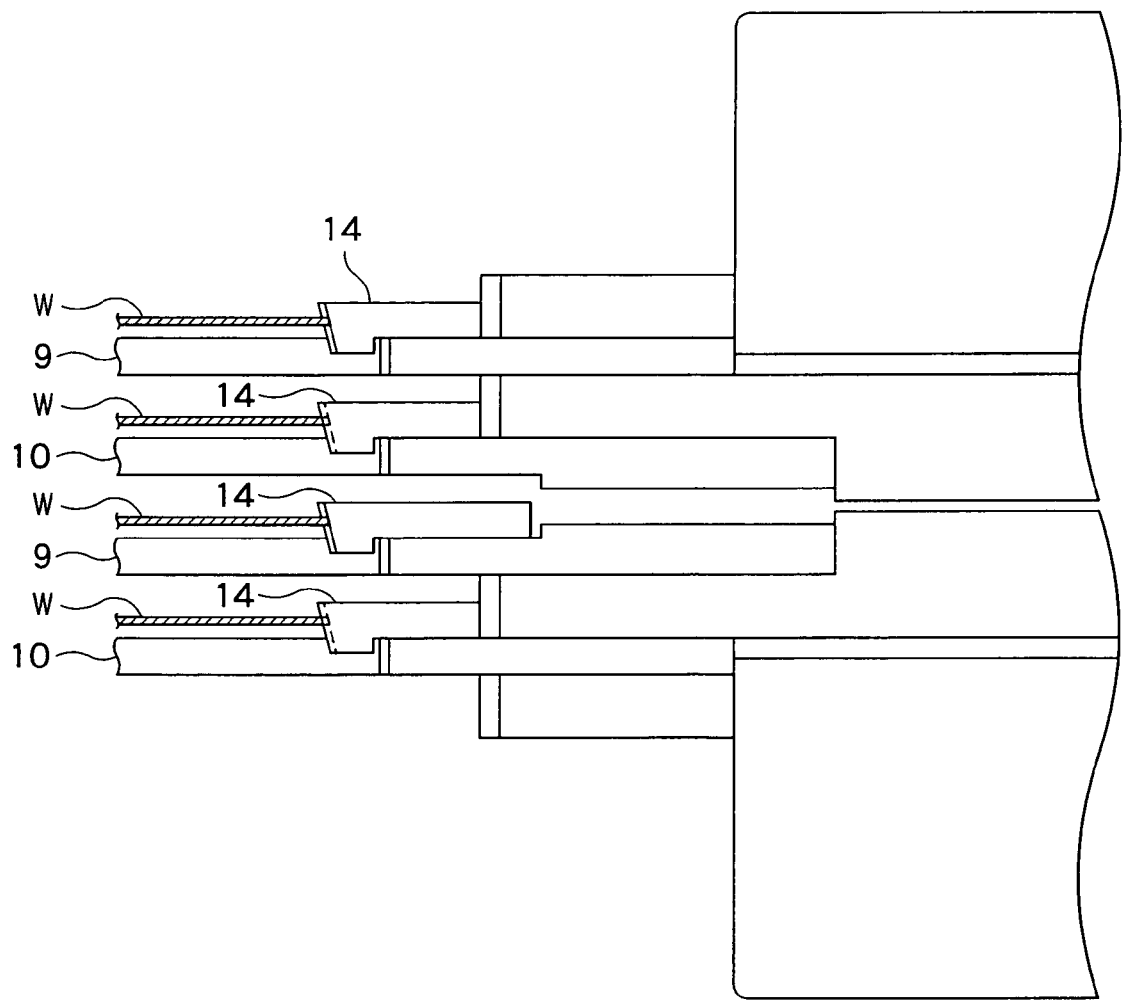
FIG. 7 is an enlarged schematic view showing movable contact parts and peripheral portions of respective edge guide mechanisms of the end effector shown in FIG. 2.

Namely, in this embodiment, the interval in the vertical direction between the pair of upper and lower movable contact parts 14, 14 of the respective end effectors 6, 7 is fixed. In addition, as shown in FIG. 7, each movable contact part 14, 14 is located in such a position that the contact part 14 can be brought into contact with the edge of each wafer W that will be held by the respective blades 9, 10 when the interval in the vertical direction between the pair of movable blades 9, 10 is the maximum interval.

Of course, the upper movable contact part 14 may be configured to be vertically moved together with the movable blade 9. However, in this embodiment, the wafer W has only to be fixedly held by the upper movable contact part 14 when the movable blade 9 is located above the fixed blade 10. Therefore, in order to avoid structural complication of each edge guide mechanism 16, the interval in the vertical direction between the pair of upper and lower movable contact parts 14 is fixed.

In the case in which the maximum interval in the vertical direction between the movable blade 9 and the fixed blade 10 is designated by D and the pitch of the wafers respectively arranged in the cassette (or FOUP: Front Opening Unified Pod) is denoted by P, the maximum interval D can be expressed by the following range:

$nP < D < (n+1)P$ (wherein $n$ is a natural number), and preferably $nP < D \leq (n+1)P$ (wherein $n$ is a natural number including 0).

Preferably, n is zero (i.e., n=0) in the above expression. Namely, the maximum interval D is greater than 0 and smaller than one wafer arrangement pitch P. It is noted that each cassette (or FOUP) is prepared herein, based on the SEMI (Semiconductor Equipment and Materials International) standard.

Further, in this embodiment, the movable blade 9 is used as an outer blade, while the fixed blade 10 is used as an inner blade. However, the movable blade may be used as the inner blade, while the fixed blade may be used as the outer blade. Alternatively, both of the blades may be used as the movable blades. Namely, any suitable configuration of the blades can be applied to this embodiment, provided that such configuration can allow the interval in the vertical direction between both of the blades to be changeable.

In one variation of the above embodiment, as shown in FIGS. 8 and 9, two (or otherwise three or more) movable blades 9, 9' (and the driving means for the respective movable blades) may be provided. In this case, as shown in FIG. 9, the maximum interval D1 between the upper movable blade 9 and the lower movable blade 9' may be different from or equal to the maximum interval D2 between the lower blade 9' and the fixed blade 10. In FIG. 9, for better understanding and clarity, the positions of the distal ends of the respective blades 9, 9' and 10 are matched relative to one another in the forward direction.

In place of the air cylinder 17, a servo-motor may be used as the lift means for the movable blade 9. In this case, the interval between the movable blade 9 and the fixed blade 10 can be optionally determined between the maximum interval (i.e., the interval between the blades spaced farthest away from each other as shown in FIG. 3) and the minimum interval (i.e., the interval between the blades positioned nearest to each other as shown in FIG. 4). Further, in this case, the movable contact part 14 of the edge guide mechanism 16 for the movable blade 9 may have a width extended in the vertical direction, to some extent, corresponding to the range in which the movable blade 9 is lifted.

Alternatively, in place of using the air cylinder 17 as the lift means for the movable blade 9, a rotary lift mechanism as shown in FIG. 10 may be employed. For example, with rotation of a pair of movable support members 20 respectively used as the rotary lift mechanism, from such a position as shown in FIG. 10(A) up to another position as shown in FIG. 10(B), the movable blade 9 can be pushed downward by the movable support members 20. As a result, the movable blade 9 can be lowered toward the fixed blade 10.

Alternatively, as shown in FIG. 11, a proper suction mechanism including several suction members 21 (e.g., one large suction member 21+three small suction members 21), each adapted for providing vacuum suction to the wafer, may be provided in place of the edge guide mechanism 16.

Figure 12:
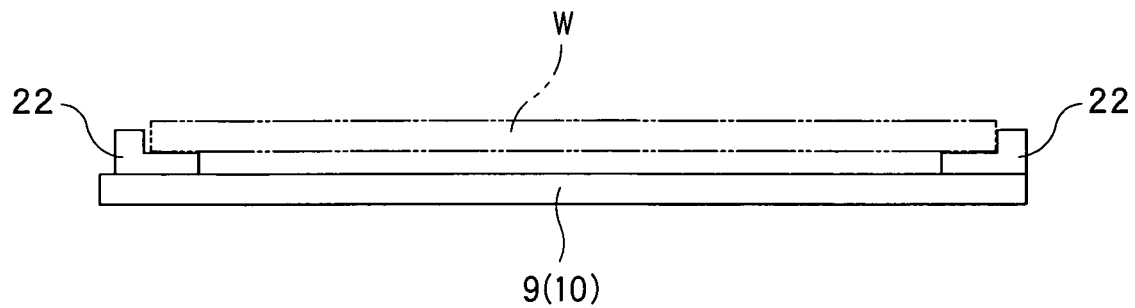
FIG. 12 is a schematic side view showing still another variation of the end effector of the robot shown in FIG. 1, wherein the end effector includes a wafer fitting mechanism (i.e., a wafer holding mechanism).

Alternatively, as shown in FIG. 12, the wafer W may be fitted in a recess formed by a plurality of pads 22 respectively arranged along an outer shape of the wafer W.

Figure 13:
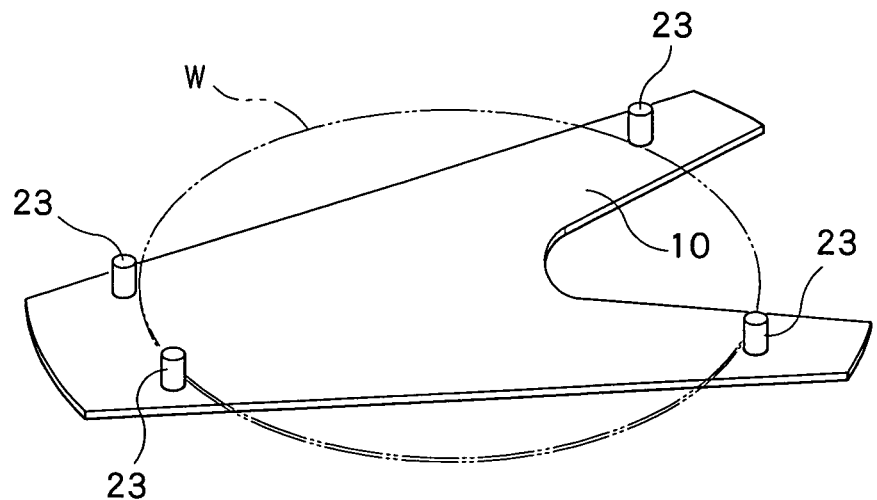
FIG. 13 is a schematic side view showing still another variation of the end effector of the robot shown in FIG. 1, wherein the end effector includes a wafer surrounding mechanism (i.e., another wafer holding mechanism).

Alternatively, as shown in FIG. 13, the wafer W may be surrounded or held by a plurality of pins 23 respectively arranged along the outer shape of the wafer W.

Alternatively, the wafer W may be held by friction generated between the wafer W and each wafer holding face of the respective blades. Otherwise, the wafer W may be held, in a non-contact manner, such as by utilizing a suitable fluid, static electricity, ultrasonic waves or the like.

Alternatively, in place of using the movable blade 9 and the fixed blade 10 as described in the above embodiment, the blade 9 may be fixed, while the blade 10 may be movable. Otherwise, both of the blades 9 and 10 may be provided as the movable blades. In short, any given configuration suitable for allowing the interval in the vertical direction between such blades to be changeable can be applied to this embodiment.

Alternatively, in place of the edge guide mechanisms 16 respectively provided corresponding to the upper wafer W and lower wafer W as described in the above embodiment, a common edge guide mechanism may be provided for the upper and lower wafers W. In this case, it is preferred that such a common edge guide mechanism includes an elastic element capable of adequately absorbing or canceling a positional shift between the upper and lower wafers W.

While the distal ends of the two blades 9, 10 have been described in the above embodiment as those shifted in position relative to each other in the forward direction, these distal ends may correspond to each other depending on the shape of each blade.

While the stoppers 19A, 19B have been described in the above embodiment as those respectively provided separately from the air cylinder 17, such stoppers may be respectively incorporated in the air cylinder.

Alternatively, while the cassette (or FOUP) has been described in the above embodiment, as a means for placing and/or storing the plurality of wafers therein, any other suitable means or unit having multiple stages adapted for placing the plurality of wafers thereon can be applied to this embodiment. In this case, the interval between the wafers placed on the respective multiple stages may not be necessarily constant. For instance, in the case in which many kinds of such means respectively having the multiple stages are used, at least one of the means may satisfy the above condition.

While the two end effectors 6, 7 are provided in the above embodiment, the number of such end effectors may be one, or otherwise three or more. Alternatively, one of the two end effectors may be of a fixed-blade-type having a plurality of fixed blades respectively arranged with a fixed interval in the vertical direction. Namely, the movable-blade-type end effector as described in this embodiment and the fixed-blade-type end effector may be used in a suitable combination.

As described in the above embodiment, when the movable blade 9 is lowered nearest to the fixed blade 10, each wafer holding face 9A of the movable blade 9 will be substantially flush with each wafer holding face 10A of the fixed blade 10. However, if the total thickness in the vertical direction of the two blades 9, 10 is set to be smaller than the wafer arrangement pitch of the wafer cassette, each wafer holding face 9A may not be necessarily flush with each wafer holding face 10A when the movable blade 9 is moved nearest to the fixed blade 10.

For instance, the total thickness in the vertical direction of the two blades 9, 10 may be set to be equal to or smaller than a certain blade-insertable thickness (i.e., the maximum value of the thickness that can allow the two blades to be inserted together in each space or slot between adjacent two stages of the cassette). More specifically, the term "blade-insertable thickness between the adjacent two stages of the cassette" means the total thickness of the blades or, in the case that a wafer is held by the blade, total thickness of the blades and the wafer that can allow such blades and/or wafer to be inserted in the space or slot between the adjacent stages of the cassette, without contacting any stage and/or wafer already placed thereon.

It should be noted that the term "total thickness in the vertical direction of the two blades 9, 10" as used herein refers to the total thickness of parts of the respective blades 9, 10 that are respectively inserted in the wafer cassette (or FOUP). In other words, this term is not intended, in any way, to imply any other part of each blade that is not inserted in the wafer cassette.

Figure 14:
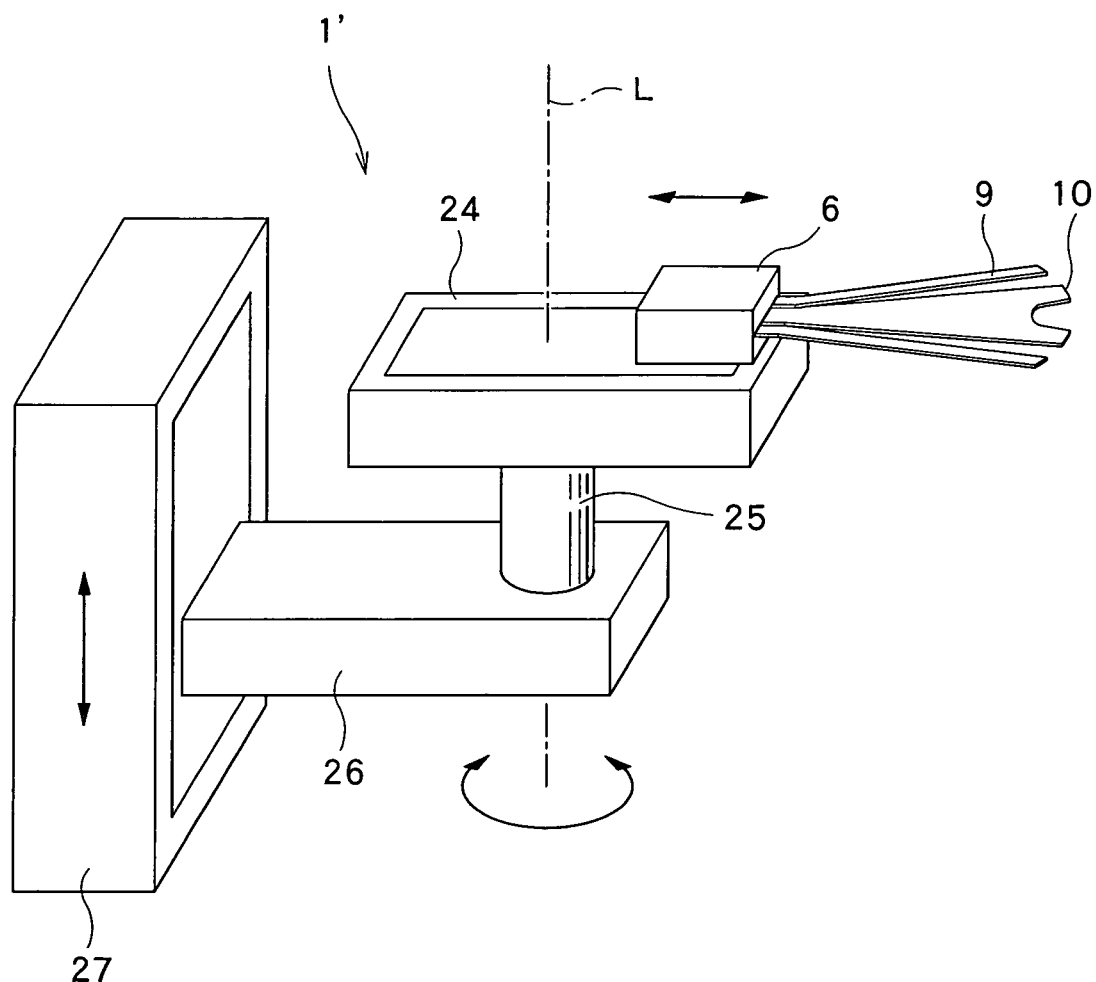
FIG. 14 is a schematic perspective view showing the end effector shown in FIG. 1, wherein the end effector is provided to a robot of a type different from the robot shown in FIG. 1.

Alternatively or additionally, the end effector 6 according to this embodiment may be provided to another robot 1' as shown in FIG. 14. This robot 1' includes a horizontal drive arm 24 adapted for horizontally driving the end effector 6, a rotation arm 25 adapted for rotating the horizontal drive arm 24 about a vertical axis L, and a lift arm 27 adapted for lifting a horizontal support member 26 adapted for supporting the rotation arm 25.

Although this invention is described herein by way of example, in regard to the robot adapted for carrying each substrate or wafer horizontally held on each blade, this robot, to which the end effector according to this invention can be provided or attached, is not limited to such aspects as respectively shown in FIGS. 1 and 14. For instance, the end effector of this invention may be attached to the robot adapted for carrying each substrate or wafer held in a non-horizontal state (e.g., each wafer held in the vertical direction).

Thus, this invention can be applied to any suitable robot capable of automatically moving the end effector to a desired position.

Additionally, the object to be carried by the end effector according to this invention is not limited to the semiconductor wafers (i.e., circular substrates) as described above. For instance, this end effector can also be applied to the transfer of any suitable glass substrates (i.e., rectangular substrates) used for liquid crystal panels, solar panels and the like.

Now, the method of operating the robot according to the above embodiment will be discussed.

The method of operating the robot according to this embodiment includes a first step of carrying two wafers W at a time by using both of the movable blade 9 and fixed blade 10 of the first end effector 6 (see FIG. 2), and a second step of driving the movable blade 9 to move in the vertical direction up to the position nearest to the fixed blade 10 and then carrying one wafer W by using the first end effector 6 (see FIG. 6).

In the first step, the first end effector 6 may be used together with the second end effector 7, or otherwise may be used alone.

In this method, the second step may be performed prior to the first step. Otherwise, the wafer transfer may be performed in a desired sequence, while the first step and second step are carried out in a proper combination thereof.

Various sequence patterns, each designed for carrying the wafers, are shown in FIGS. 15 through 20, respectively.

Figure 15:
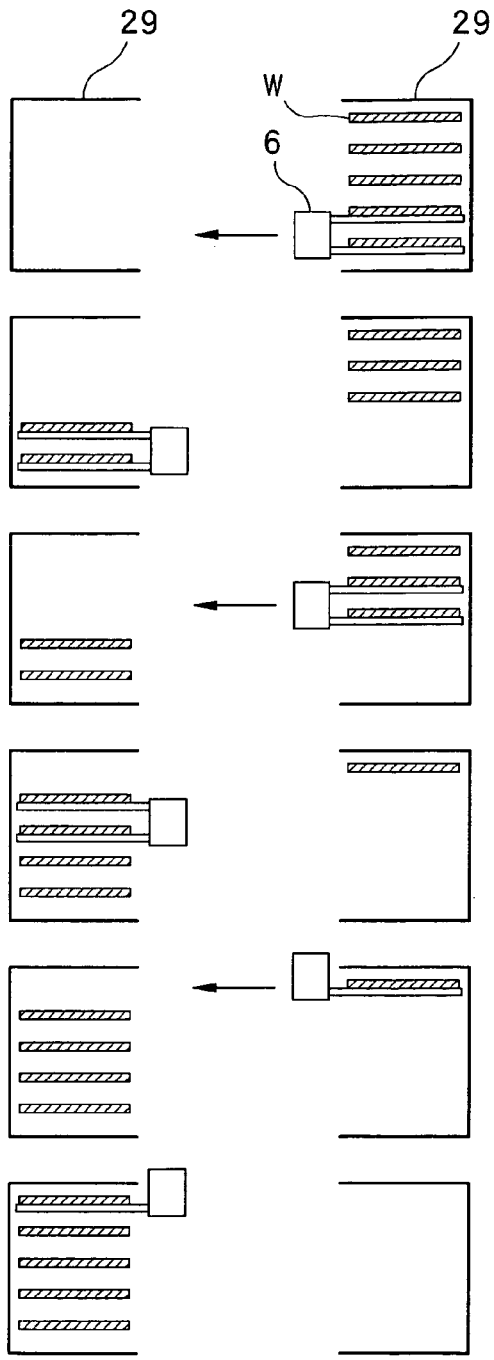
FIG. 15 is a diagram for illustrating a sequence pattern 1 of the wafer transfer using the robot of this invention.

In the sequence pattern 1 as shown in FIG. 15, the lowest two wafers are first taken out by the first end effector 6 from the cassette 29 depicted on the right side in the drawing, and then inserted in the lowest part of another cassette 29 depicted on the left side in the drawing. Thereafter, other two wafers just above the two wafers that have been taken out by the first end effector 6 are taken out from the right side cassette 29, and then inserted just above the two wafers already inserted in the left side cassette 29. Subsequently, the movable blade 9 of the first end effector 6 is driven, such that each wafer holding face 9A of the movable blade 9 can be substantially flush with each wafer holding face 10A of the fixed blade 10. Thereafter, the wafer placed in the highest part of the right side cassette 29 is taken out therefrom, and then inserted in the highest part of the left side cassette 29.

Namely, in this pattern 1 shown in FIG. 15, with the wafer transfer selectively performed for the one wafer W placed on the highest stage and for the respective two wafers W on the other stages by using the first end effector 6, the interference between the robot 1 and each wafer cassette 29 can be successfully avoided.

Figure 16:
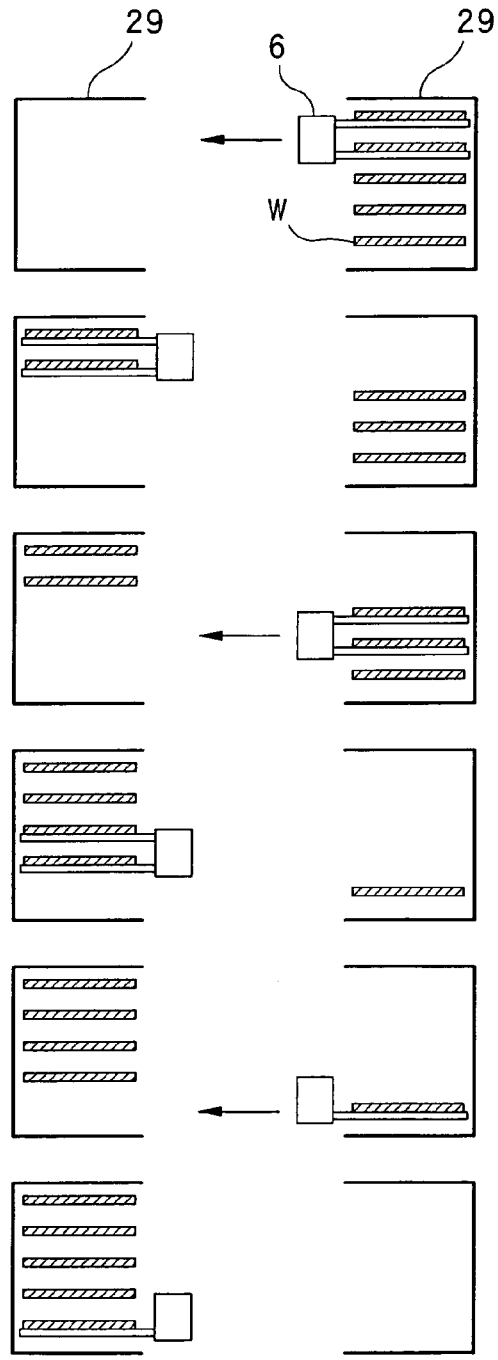
FIG. 16 is a diagram for illustrating another sequence pattern 2 of the wafer transfer using the robot of this invention.

In the sequence pattern 2 as shown in FIG. 16, the highest two wafers are first taken out by the first end effector 6 from the right side cassette 29, and then inserted in the highest part of the left side cassette 29. Thereafter, other two wafers just below the two wafers that have been taken out by the first end effector 6 are taken out from the right side cassette 29, and then inserted just below the two wafers already inserted in the left side cassette 29. Subsequently, the movable blade 9 of the first end effector 6 is driven, such that each wafer holding face 9A of the movable blade 9 can be substantially flush with each wafer holding face 10A of the fixed blade 10. Thereafter, the wafer placed in the lowest part of the right side cassette 29 is taken out therefrom, and then inserted in the lowest part of the left side cassette 29.

In this pattern 2 shown in FIG. 16, with the wafer transfer selectively performed for the one wafer W placed on the lowest stage and for the respective two wafers W on the other stages by using the first end effector 6, the interference between the robot 1 and each wafer W can be avoided.

Figure 17:
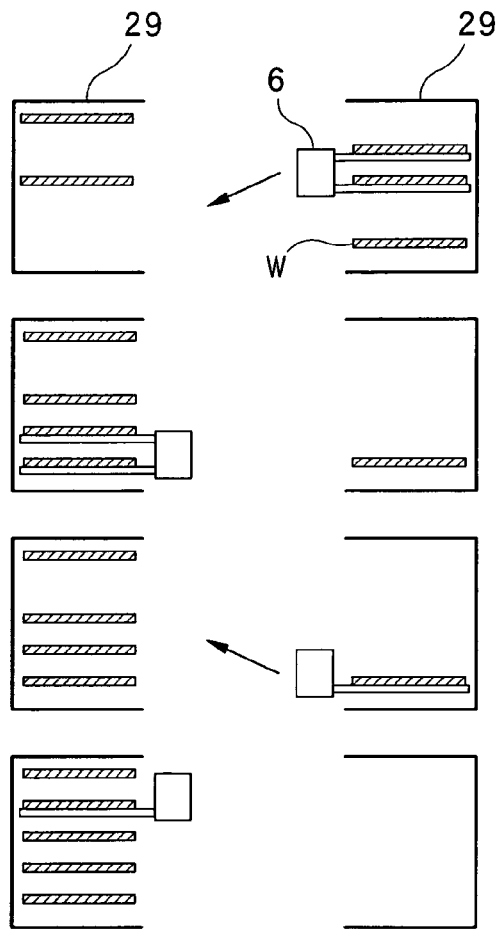
FIG. 17 is a diagram for illustrating still another sequence pattern 3 of the wafer transfer using the robot of this invention.

In the sequence pattern 3 as shown in FIG. 17, while one wafer is placed on the highest stage and another wafer is placed on a middle stage of the left side cassette 29, two wafers are taken out by the first end effector 6 from the right side cassette 29, and then inserted in the lowest part of the left side cassette 29. Then, the movable blade 9 of the first end effector 6 is driven, such that each wafer holding face 9A of the movable blade 9 can be substantially flush with each wafer holding face 10A of the fixed blade 10. Thereafter, the wafer placed in the lowest part of the right side cassette 29 is taken out therefrom, and then inserted into a space between the wafers already placed on the highest and middle stages of the left side cassette 29.

Namely, in this pattern 3 shown in FIG. 17, with the wafer transfer selectively performed for the two wafers W to be placed on the two adjacent vacant stages and for the one wafer W to be placed on the one vacant stage, the interference between the robot 1 and each wafer W can be successfully avoided.

Figure 18:
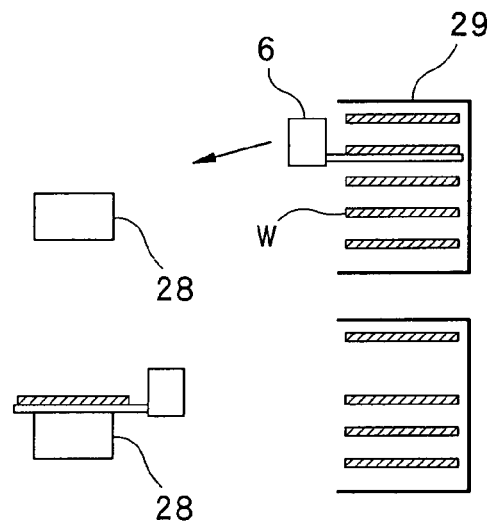
FIG. 18 is a diagram for illustrating still another sequence pattern 4 of the wafer transfer using the robot of this invention.

In the sequence pattern 4 as shown in FIG. 18, while each wafer holding face 9A of the end effector 6 is moved to be substantially flush with each wafer holding face 10A, one wafer is first taken out from the right side cassette 29 and then carried onto a certain place 28. Namely, in this pattern 4 shown in FIG. 18, only one wafer W can be selectively carried when it is necessary to carry one certain wafer W (e.g., when the wafer W is carried onto the place 28 on which only one wafer W can be placed, or when only one certain wafer W placed in the wafer cassette 29 is required to be carried). Further, when it is necessary to collectively carry the plurality of wafers, two wafers can be carried for each operation. Therefore, this pattern 4 can render the wafer handling process more flexible as well as can reduce the time required for the process.

Figure 19:
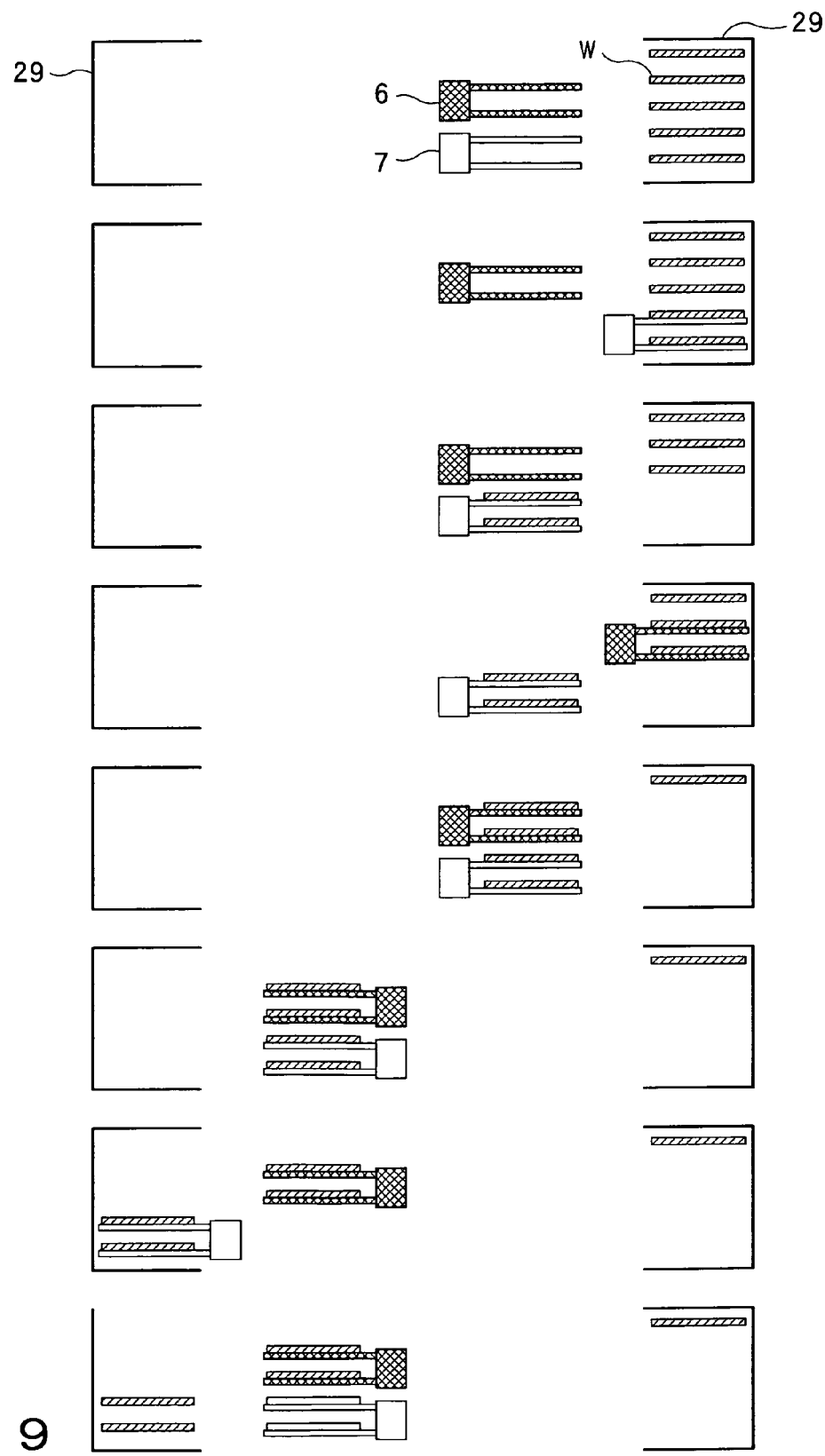
FIG. 19 is a diagram for illustrating the first half of still another sequence pattern 5 of the wafer transfer using the robot of this invention.
Figure 20:
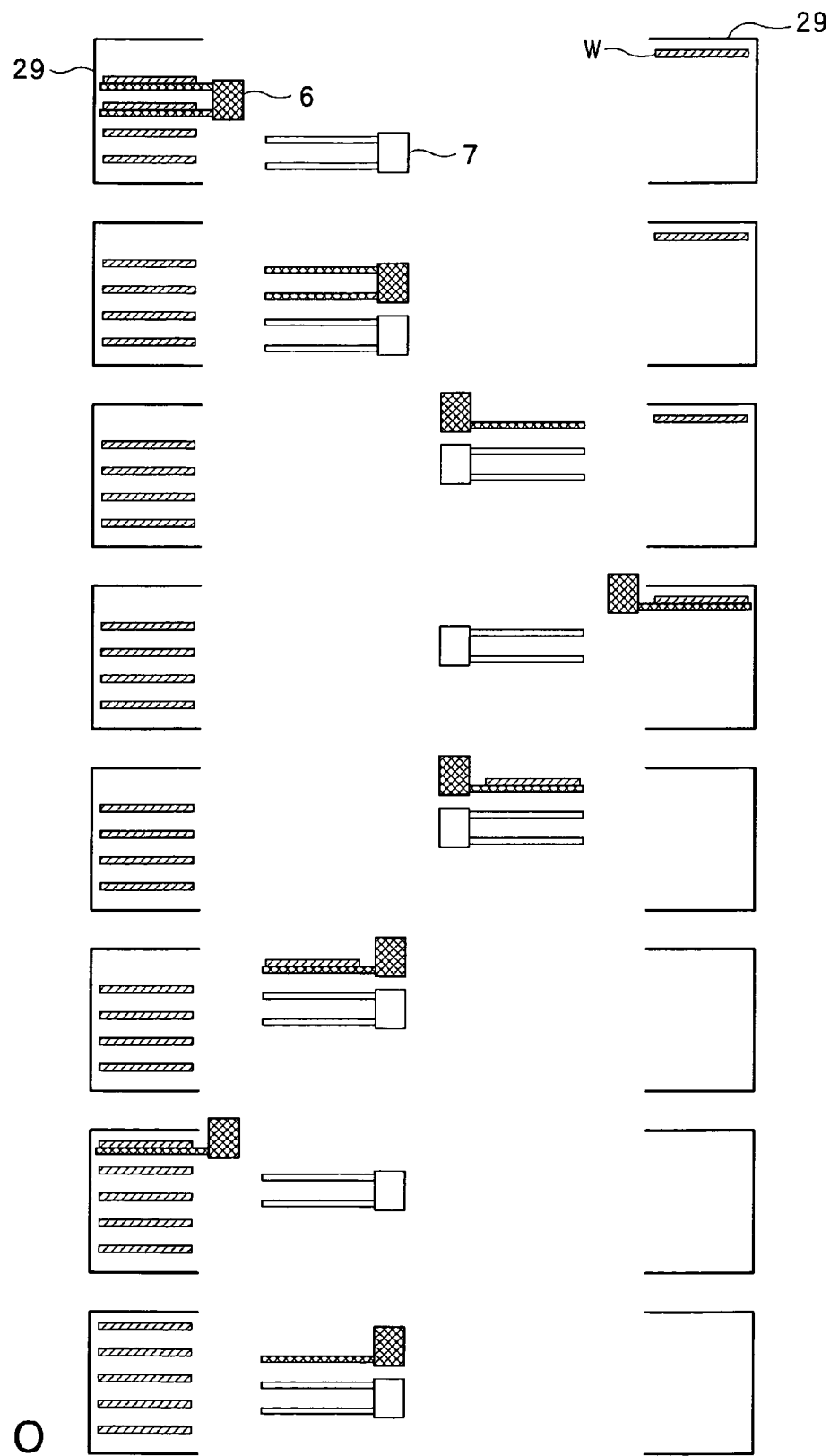
FIG. 20 is a diagram for illustrating the second half of the sequence pattern 5 of the wafer transfer using the robot of this invention.

In the sequence pattern 5 as shown in FIGS. 19 and 20, the lowest two wafers are first taken out by the second end effector 7 from the right side cassette 29, and then other two wafers just above the lowest two wafers are taken out by the first end effector 6 from the right side cassette 29. Subsequently, the two wafers respectively held on the second end effector 7 are inserted in the lowest part of the left side cassette 29, and then the two wafers respectively held on the first end effector 6 are inserted in a space of the left side cassette 29 just above the two wafers already inserted in the lowest part of the left side cassette 29. Then, the movable blade 9 of the first end effector 6 is driven, such that each wafer holding face 9A of the movable blade 9 can be substantially flush with each wafer holding face 10A of the fixed blade 10. Thereafter, by using this first end effector 6, the highest one wafer placed in the right side cassette 29 is taken out therefrom, and then inserted in the highest part of the left side cassette 29.

Namely, in this pattern 5 shown in FIGS. 19 and 20, with the wafer transfer using both of the first and second end effectors 6, 7 as described above, any of four sheets (two sheets+two sheets), three sheets (two sheets+one sheet), two sheets (one sheet+one sheet, or otherwise two sheets+0 sheet) and only one sheet of the wafers can be selectively and/or optionally carried, thereby rendering the handling process for each wafer W more flexible as well as allowing the process to be performed in a shorter time.

Typical sizes of each wafer and each corresponding cassette can be mentioned as follows.

For instance, when the thickness of the wafer having a 150 mm (6-inch) diameter is 0.625 mm, the wafer pitch of the corresponding cassette is 4.76 mm.

Alternatively, the thickness of the wafer having a 200 mm (8-inch) diameter is 0.725 mm, and the wafer pitch of the corresponding cassette is 6.35 mm.

Otherwise, the thickness of the wafer having a 300 mm (12-inch) diameter is 0.775 mm, and the wafer pitch of the corresponding cassette is 10 mm.

Further, in the case of handling the wafers respectively having the 300 mm diameter, the aforementioned blade-insertable thickness between the adjacent two stages of the cassette is set at 9.225 mm (i.e., 10 mm−0.775 mm).

Next, another (or second) embodiment of the present invention will be described.

While the first embodiment that has been discussed above is primarily intended to switch, selectively and/or optionally, the operation for holding the plurality of wafers and the operation for holding one wafer, by using one end effector, the second embodiment is chiefly intended to change the blade faces of the one end effector, depending on the application.

In other words, in the second embodiment, the application or use of each blade (i.e., the movable blade 9 or fixed blade 10) is changed in at least one of the first and second end effectors 6 and 7 (hereinafter, one case in which the application of each blade of the first end effector 6 is optionally changed will be discussed by way of example). For instance, in this case, the movable blade 9 is used for a clean (or cleaned) environment and/or wafer, while the fixed blade 10 is used for an unclean (or uncleaned) environment and/or wafer. Alternatively or additionally, the movable blade 9 is used for a high temperature environment and/or wafer, while the fixed blade 10 is used for a normal temperature environment and/or wafer. While the movable blade 9 and the fixed blade 10 are employed in this embodiment, both of the two blades may be movable herein.

Figure 21:
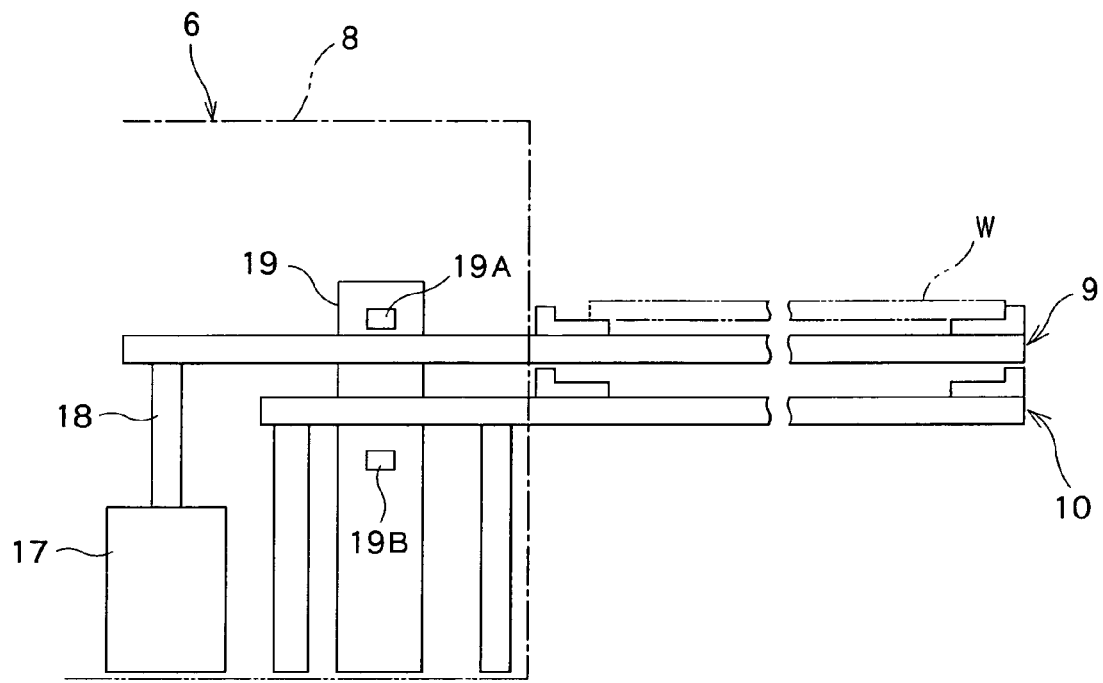
FIG. 21 is a schematic diagram showing the end effector of a robot according to another (or second) embodiment of this invention with a movable blade located at the highest position thereof.
Figure 22:
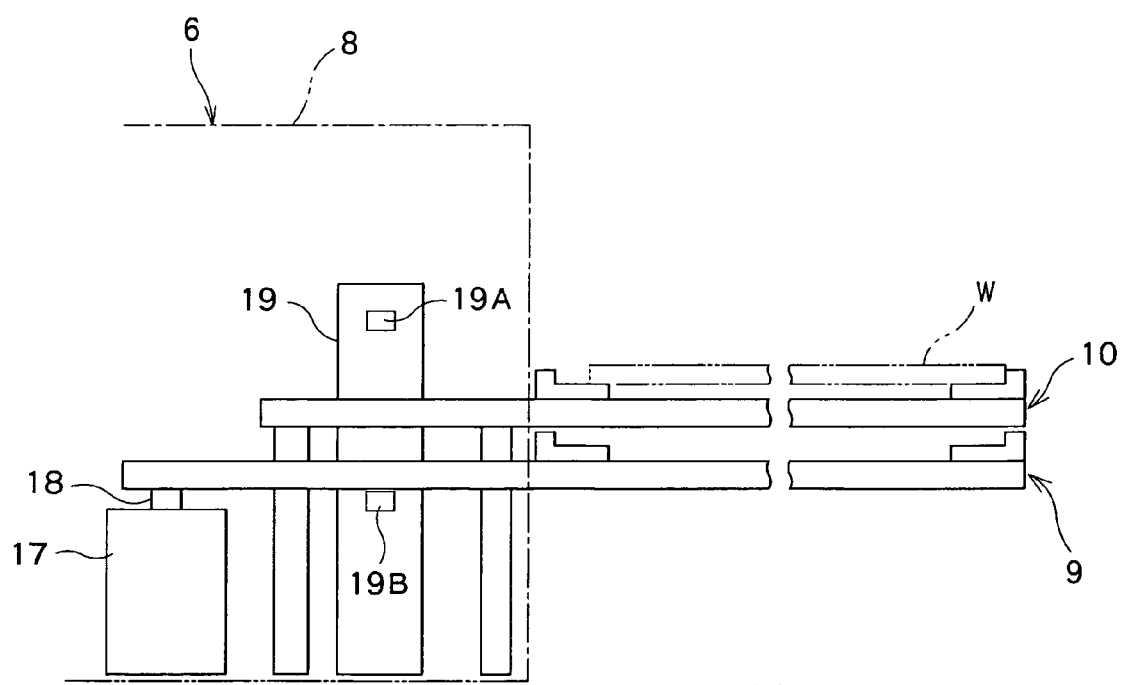
FIG. 22 shows the end effector shown in FIG. 21 with the movable blade located at the lowest position thereof.

Further, in this embodiment, the positions of the upper and lower stoppers 19A and 19B are respectively altered as shown in FIGS. 21 and 22, as compared with the positions shown in FIGS. 3 and 4. Specifically, the position of the upper stopper 19A is substantially lowered as compared with the first embodiment (shown in FIGS. 3 and 4), while the position of the lower stopper 19B is slightly lowered as compared with the first embodiment.

In this embodiment, as shown in FIG. 22, when the movable blade 9 is moved to the lowest position thereof (or when this blade 9 is in contact with the lower stopper 19B), each wafer holding face 9A of the movable blade 9 is not flush with each wafer holding face 10A of the fixed blade 10, while the wafer holding face 10A of the fixed blade 10 is slightly projected on the wafer holding side (or upward as shown in FIG. 22), as compared with the wafer holding face 9A of the movable blade 9.

Meanwhile, when the movable blade 9 is located at the highest position thereof (or when this blade 9 is in contact with the upper stopper 19A), each wafer holding face 9A of the movable blade 9 is slightly projected on the wafer holding side relative to each wafer holding face 10A of the fixed blade 10.

As shown in FIGS. 21 and 22, when seen in the horizontal direction, this embodiment has one exemplary construction in which both of the blades 9, 10 are not directly overlapped with each other. If required, however, the two blades 9, 10 may be partly overlapped with each other.

Thus, by lifting the movable blade 9 with the actuation of the air cylinder 17, this embodiment can selectively switch one operational state in which the movable blade 9 is projected on the wafer holding side relative to the fixed blade 10 and another operational state in which the fixed blade 10 is in turn projected on the wafer holding side relative to the movable blade 9.

Additionally, in this embodiment, the interval in the vertical direction between the upper stopper 19A and the lower stopper 19B is suitably set to avoid the occurrence of interference between the movable blade 9 or fixed blade 10 and each slot in the cassette (or FOUP) 29 located adjacent to the slot in which the wafer W to be carried by the blade is placed. More specifically, with such setting of the interval between the upper and lower stoppers 19A and 19B, the distance between each wafer holding face of one blade used for one application to be currently performed and each wafer holding face of the other blade used for another application not to be currently performed can be set within a range defined by the wafer arrangement pitch P.

In this embodiment, the movable blade 9 can be moved or lifted in the vertical direction with respect to a 0 mm reference position in which the movable blade 9 is flush with the fixed blade 10. In this case, the distance that the movable blade 9 is lifted can be optionally set within such a range that can satisfy the condition (a) that the blade used for the application not to be currently performed can be adequately separated or evacuated from the other blade used for the application to be currently performed, as well as satisfy the condition (b) that the blade used for the application not to be currently performed will not interfere with any other slots in the cassette (or FOUP) than the slot in which the wafer W to be carried is placed, as well as not interfere with the wafers respectively placed in the other slots.

For satisfying the above condition (a), it is necessary to separate each wafer holding face of the blade used for the application to be currently performed from each wafer holding face of the blade used for the application not to be currently performed, with a distance greater than at least 0 mm. Meanwhile, in order to satisfy the second condition (b), for example, it is necessary to set the total thickness of the plurality of blades in the direction vertical to each wafer to be less than the aforementioned blade-insertable thickness (i.e., the maximum value of the thickness that can allow the blades to be inserted together in the space or slot of interest between adjacent stages of the cassette). Especially, in view of errors associated with the production of the respective blades, end effectors (hands) and cassettes (or FOUPs) as well as vibrations or the like generated upon the operation of the carrying apparatus, it is preferred that the distance between each wafer holding face of the blade used for the application to be currently performed and each wafer holding face of the other blade used for the application not to be currently performed is set within a range of 5 to 30% of the wafer arrangement pitch.

It is noted that the distance that the movable blade 9 can be moved upward is not necessarily equal to the distance that the blade 9 can be moved downward with respect to the reference position flush with the fixed blade 10.

In this embodiment, two wafers cannot be taken out at a time by the first end effector 6. However, by setting the interval between the first end effector 6 and the second end effector 7 to be equal to the wafer arrangement pitch P, the two wafers can be taken out, at a time, by using such a combination of the two end effectors 6, 7.

According to this embodiment, for example, the movable blade 9 can be used for the clean environment and/or wafer, while the fixed blade 10 can be used in the unclean environment and/or wafer. In this case, when the clean (or cleaned) wafers W are taken out from the cassette or the like, the movable blade 9 will be positioned above (or on the wafer holding side) relative to the fixed blade 10. Meanwhile, upon taking out the unclean (or uncleaned) wafers W from the cassette or the like, the movable blade 9 will be evacuated downward, while the fixed blade 10 is projected above relative to the movable blade 9. In this way, this embodiment can allow a single end effector to be used for both of the clean and unclean environments or wafers.

In this embodiment, while the blade used for the application not to be currently performed is evacuated downward, this blade may be evacuated upward, relative to the other blade used for the application to be currently performed.

By the way, in the first embodiment as shown in FIGS. 3 and 4, the applications for handling the wafers can also be changed, such as by using the two blades 9, 10 of the first end effector 6 for respectively handling the clean or cleaned wafers, while using the two blades 12, 13 of the second end effector 7 for respectively handling the unclean or uncleaned wafers. Meanwhile, in the second embodiment as shown in FIGS. 21 and 22, two wafers can also be carried at a time for each application, such as by utilizing one exemplary configuration described below with reference to FIGS. 23 and 24.

Figure 23:
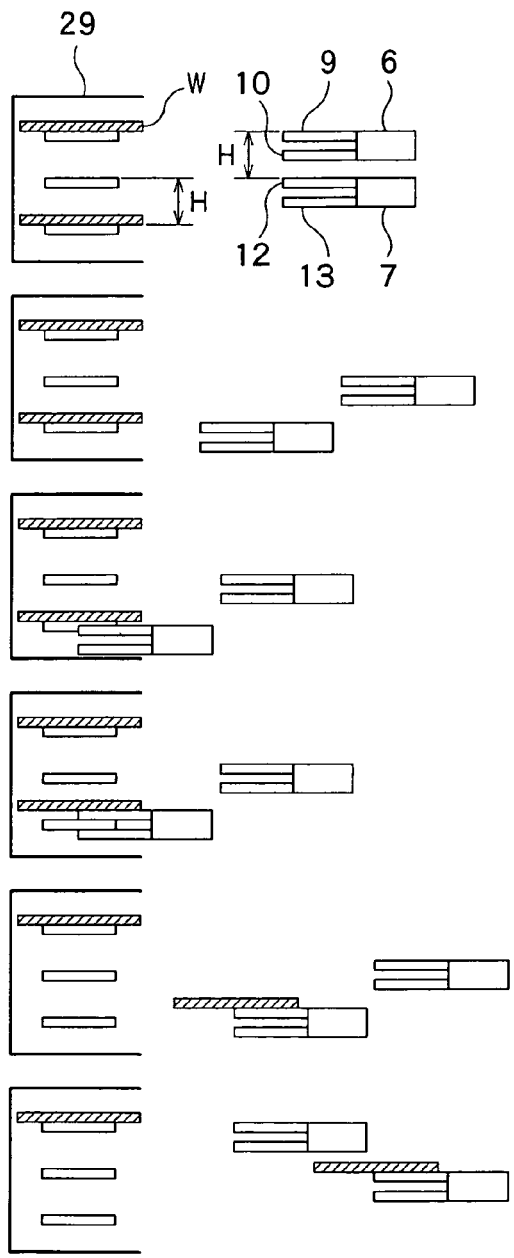
FIG. 23 is a diagram for illustrating the first half of another sequence pattern of the wafer transfer using the robot of this invention.
Figure 24:
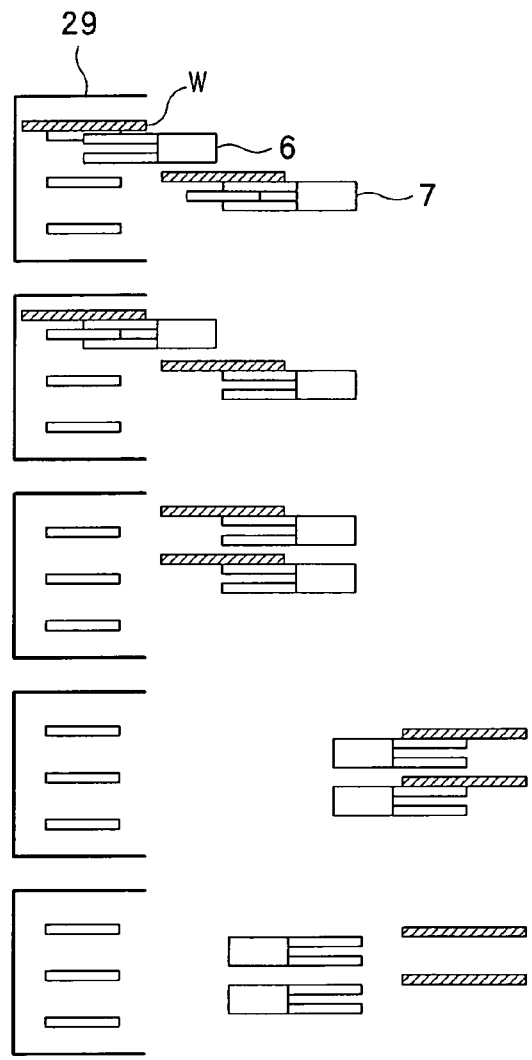
FIG. 24 is a diagram for illustrating the second half of the sequence pattern of the wafer transfer shown in FIG. 23.

Namely, in the example as shown in FIGS. 23 and 24, each of the first and second end effectors 6 and 7 is configured as shown in FIGS. 21 and 22, wherein the movable blades 9 of such end effectors 6, 7 are respectively used for handling the clean or cleaned wafers, while the fixed blades 10 of the end effectors 6, 7 are respectively used for handling the unclean or uncleaned wafers.

In the operation of this example, first, as shown in FIG. 23, the lowest clean wafer W is taken out from the cassette 29 by the movable blade 12 of the second end effector 7. Subsequently, as shown in FIG. 24, the highest clean wafer W is taken out from the cassette 29 by the movable blade 9 of the first end effector 6. In this way, such two clean wafers W can be carried at a time to another cassette, while being respectively held by the end effectors 6, 7.

For simplification, as shown in FIGS. 23 and 24, each end effector that is not used is depicted as evacuated in the horizontal or lateral direction. However, each end effector may be evacuated in the direction perpendicular to the paper sheet of each drawing, by rotation of the end effector about an axis thereof extending in the vertical direction in the drawing.

While the present invention has been shown and described in regard to the several preferred embodiments, it should be construed that various modifications can be made thereto, without departing from the scope of this invention.

The invention claimed is:

1. An end effector configured to be provided to an arm of a robot, comprising:
   a plurality of blade members configured to respectively hold substrates, the blade members being configured such that each interval between the blade members is changeable;
   a blade support unit configured to support the plurality of blade members, the blade support unit being configured to be driven integrally with the plurality of blade members by the robot; and
   a blade drive unit configured to change the interval between the blade members by moving at least one of the plurality of blade members relative to another blade member,
   wherein a total thickness of the plurality of blade members in a direction perpendicular to a surface of the substrate is reduced to be less than a predetermined thickness when the interval between the blade members is shortened by the blade drive unit, the predetermined thickness being set as a blade-insertable thickness defined between adjacent stages of multiple stages on which the substrates are placed,
   wherein each of the blade members has a holding unit configured to hold the substrate in order to prevent the substrate from being detached from the blade member upon transferring the substrate,
   wherein the holding unit includes an edge guide mechanism having a movable contact part configured to be brought into releasable contact with an edge of the substrate,
   wherein the edge guide mechanism of each of the blade members is configured to be driven independently with each other, and
   wherein the movable contact part is configured to be vertically moved together with the blade member.

2. The end effector according to claim 1, wherein the plurality of blade members are configured not to be overlapped with one another when seen in a direction perpendicular to the surface of the substrate held by the blade member.

3. The end effector according to claim 1,
   wherein the blade members respectively have substrate holding parts configured to be brought into contact with the substrates, and
   wherein the substrate holding parts of the blade members are configured to be substantially flush with one another when the interval between the blade members is shortened by the blade drive unit.

4. A robot comprising:
   the end effector according to claim 1; and
   an arm to which the end effector is provided.

5. The robot according to claim 4, wherein an additional end effector is provided such that the additional end effector is configured to be driven independently of the end effector.

6. A method of operating the robot according to claim 5, comprising the steps of:
   carrying a plurality of substrates at a time by using both of the end effector and the additional end effector; and
   carrying one or more substrates by using either one of the end effector and the additional end effector.

7. A method of operating the robot according to claim 4, comprising the steps of:
   carrying two or more substrates at a time by using two or more blade members of the end effector; and
   carrying one substrate by using the end effector in a state that the interval between the blade members is shortened by the blade drive unit.

8. The end effector according to claim 1, wherein the end effector is able to hold a wafer having a diameter of 150 mm, and the blade-insertable thickness is 4.135 mm.

9. The end effector according to claim 1, wherein the end effector is able to hold a wafer having a diameter of 200 mm, and the blade-insertable thickness is 5.625 mm.

10. The end effector according to claim 1, wherein the end effector is able to hold a wafer having a diameter of 300 mm, and the blade-insertable thickness is 9.225 mm.

11. An end effector of a robot, comprising:
a plurality of blade members configured to respectively hold substrates, the blade members being configured such that each interval between the blade members is changeable;
a blade support unit configured to support the plurality of blade members, the blade support unit being configured to be driven integrally with the plurality of blade members by the robot; and
a blade drive unit configured to change the interval between the blade members by moving at least one of the plurality of blade members relative to another blade member;
wherein the interval of the plurality of blade members in a direction perpendicular to a surface of the substrate can be set to 0 by changing the interval between the blade members by the blade drive unit,
wherein each of the blade members has a holding unit configured to hold the substrate in order to prevent the substrate from being detached from the blade member upon transferring the substrate,
wherein the holding unit includes an edge guide mechanism having a movable contact part configured to be brought into releasable contact with an edge of the substrate,
wherein the edge guide mechanism of each of the blade members is configured to be driven independently with each other, and
wherein the movable contact part is configured to be vertically moved together with the blade member.

12. The end effector according to claim 11, wherein the blade member is provided with a positioning part with which an edge of the substrate is brought into contact so that the substrate is positioned.

13. The end effector according to claim 11, wherein the blade drive unit includes a motor.

14. A robot comprising: the end effector according to claim 11; and an arm to which the end effector is provided.

15. A method of operating the robot according to claim 14, comprising the steps of:
carrying two or more substrates at a time by using two or more blade members of the end effector; and
carrying one substrate by using the end effector in a state that the interval between the blade members is shortened by the blade drive unit.

* * * * *